US012677492B2

(12) United States Patent
Ha et al.

(10) Patent No.: US 12,677,492 B2
(45) Date of Patent: Jul. 7, 2026

(54) IMAGE SENSOR AND METHOD OF FABRICATING THE SAME

(71) Applicant: SAMSUNG ELECTRONICS CO., LTD., Suwon-si (KR)

(72) Inventors: Younsu Ha, Suwon-si (KR); Dongchan Kim, Suwon-si (KR); Minkwan Kim, Suwon-si (KR); Minju Yoon, Suwon-si (KR); Hwiyoung Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 524 days.

(21) Appl. No.: 17/991,063

(22) Filed: Nov. 21, 2022

(65) Prior Publication Data

US 2023/0163148 A1 May 25, 2023

(30) Foreign Application Priority Data

Nov. 23, 2021 (KR) ........................ 10-2021-0162165
Jun. 2, 2022 (KR) ........................ 10-2022-0067772

(51) Int. Cl.
*H10F 39/00* (2025.01)
*H10F 39/12* (2025.01)
*H10F 39/18* (2025.01)

(52) U.S. Cl.
CPC ....... *H10F 39/8053* (2025.01); *H10F 39/024* (2025.01); *H10F 39/199* (2025.01); *H10F 39/8057* (2025.01); *H10F 39/8063* (2025.01); *H10F 39/807* (2025.01); *H10F 39/811* (2025.01); *H10F 39/182* (2025.01)

(58) Field of Classification Search
CPC ......................... H10F 39/8057; H10F 39/8053
See application file for complete search history.

(56) References Cited

U.S. PATENT DOCUMENTS

| | | | |
|---|---|---|---|
| 8,698,265 B2 | 4/2014 | Yoon | |
| 9,324,755 B2 | 4/2016 | Borthakur et al. | |
| 9,911,775 B2 | 3/2018 | Kim et al. | |
| 10,129,497 B2 | 11/2018 | Iwabuchi et al. | |
| 10,950,647 B2 | 3/2021 | Umebayashi et al. | |
| 10,991,742 B2 | 4/2021 | Han et al. | |
| 11,031,425 B2 | 6/2021 | Seo et al. | |
| 2008/0042228 A1* | 2/2008 | Han ...................... | H10F 39/024 257/E31.127 |

(Continued)

FOREIGN PATENT DOCUMENTS

| | | |
|---|---|---|
| KR | 100789609 B1 | 12/2007 |
| KR | 10-1515632 B1 | 4/2015 |

(Continued)

*Primary Examiner* — Kevin Parendo
(74) *Attorney, Agent, or Firm* — Muir Patent Law, PLLC

(57) ABSTRACT

Disclosed is an image sensor comprising a substrate including a pixel area and an optically black area and having a first surface and a second surface that are opposite to each other, a plurality of color filters on the second surface of the substrate on the pixel area, and a first optically black pattern in a first recess on the second surface of the substrate on the optically black area. The first optically black pattern includes a material that is the same as a material of one of the color filters. Top surfaces of the color filters and a top surface of the first optically black pattern are at the same level.

19 Claims, 17 Drawing Sheets

(56) References Cited

U.S. PATENT DOCUMENTS

| 2010/0194941 A1* | 8/2010 | Maehara | H10F 39/8053 |
| | | | 348/282 |
| 2015/0084144 A1* | 3/2015 | Suzuki | H04N 25/76 |
| | | | 438/70 |
| 2015/0350540 A1* | 12/2015 | Borthakur | G02B 5/201 |
| | | | 348/218.1 |
| 2020/0075643 A1* | 3/2020 | Han | H10F 39/8027 |
| 2022/0020804 A1* | 1/2022 | Kim | H10F 39/8057 |

FOREIGN PATENT DOCUMENTS

| KR | 20200027248 A | 3/2020 |
| KR | 10-2021-0048399 A | 5/2021 |
| KR | 10-2021-0048401 A | 5/2021 |

* cited by examiner

IMAGE SENSOR AND METHOD OF FABRICATING THE SAME

CROSS-REFERENCE TO RELATED APPLICATIONS

This U.S. nonprovisional application claims priority under 35 U.S.C. § 119 to Korean Patent Applications No. 10-2021-0162165, filed on Nov. 23, 2021, and No. 10-2022-0067772, filed on Jun. 2, 2022, in the Korean Intellectual Property Office, the disclosures of which are hereby incorporated by reference in their entirety.

BACKGROUND

1. Field

Embodiments relate to an image sensor and a method of fabricating the same.

2. Description of the Related Art

An image sensor is a semiconductor device to transforms optical images into electrical signals. The image sensor may be classified into a charge-coupled device (CCD) type and a complementary metal oxide semiconductor (CMOS) type. The CIS (CMOS image sensor) is short for the CMOS type image sensor. The CIS may include a plurality of two-dimensionally arranged pixels. Each of the pixels includes a photodiode (PD). The photodiode serves to transform an incident light into an electrical signal.

SUMMARY

According to some embodiments, an image sensor may include: a substrate including a pixel area and an optically black area and having a first surface and a second surface that are opposite to each other; a plurality of color filters on the second surface of the substrate on the pixel area; and a first optically black pattern in a first recess on the second surface of the substrate on the optically black area. The first optically black pattern may include a material that is the same as a material of one of the color filters. Top surfaces of the color filters and a top surface of the first optically black pattern may be at the same level.

According to some embodiments, an image sensor may include: a substrate that includes a pixel area, an optically black area, and a pad area; a first recess on a top surface of the substrate on the optically black area; a second recess on the top surface of the substrate on the pad area; a plurality of color filters on the substrate on the pixel area; a first optically black pattern that conformally covers a bottom surface and inner lateral surfaces of the first recess on the optically black area; a second optically black pattern that fills an unoccupied portion of the first recess on the optically black area; and a conductive pad on the substrate on the pad area. The first optically black pattern may include a material that is the same as a material of one of the color filters. The second optically black pattern may include a material that is different from the material of the first optically black pattern and the materials of the color filters.

According to some embodiments, an image sensor may include: a substrate that includes a pixel area and an optically black area; a plurality of color filters on a top surface of the substrate on the pixel area; a first optically black pattern in a recess on the top surface of the substrate on the optically black area; a protection layer on the pixel area and the optically black area, the protection layer covering the color filters and the first optically black pattern on the top surface of the substrate; and a color separation lens array layer on the protection layer. The color separation lens array layer may have sections which correspond to the color filters and on which a plurality of nano-posts are provided. The nano-posts may be arranged to branch rays toward the color filters. The rays may have different wavelengths included in incident light. The first optically black pattern may include a material that is the same as a material of one of the color filters. Top surfaces of the color filters and a top surface of the first optically black pattern may be on one plane.

BRIEF DESCRIPTION OF THE DRAWINGS

Features will become apparent to those of skill in the art by describing in detail exemplary embodiments with reference to the attached drawings in which:

FIG. 3 illustrates a cross-sectional view showing an image sensor according to an example embodiment.

FIGS. 4 to 6 illustrate cross-sectional views showing variations of the image sensor of FIG. 3 according to various example embodiments.

FIGS. 7 and 8 illustrate cross-sectional views showing an image sensor according to respective example embodiments.

FIGS. 9 to 17 illustrate cross-sectional views showing a method of fabricating an image sensor according to an example embodiment.

DETAILED DESCRIPTION

Figure 1:
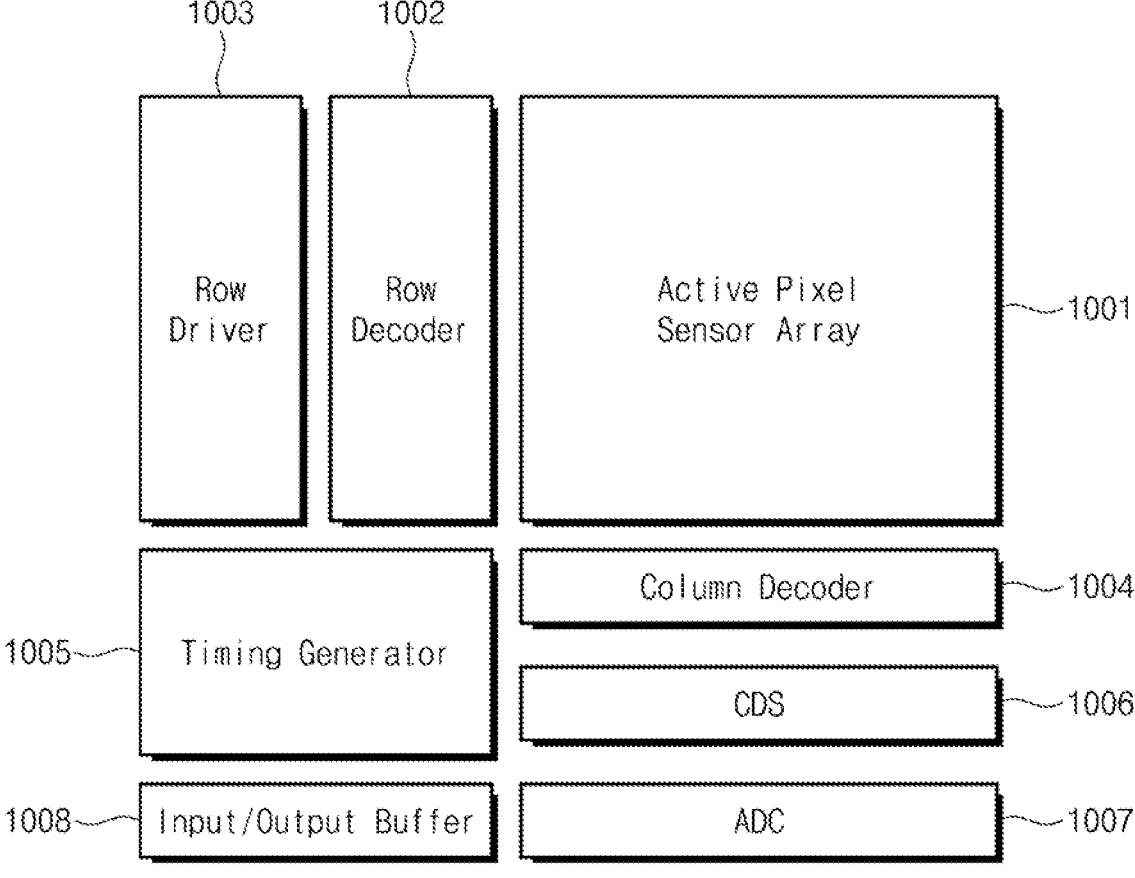
FIG. 1 illustrates a block diagram showing an image sensor according to an example embodiment.

FIG. 1 illustrates a block diagram showing an image sensor according to an example embodiment.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of two-dimensionally arranged unit pixels, each of which is configured to convert optical signals into electrical signals. The active pixel sensor array 1001 may be driven by a plurality of driving signals such as a pixel selection signal, a reset signal, and a charge transfer signal from the row driver 1003. The correlated double sampler 1006 may be provided with the converted electrical signals.

The row driver 1003 may provide the active pixel sensor array 1001 with several driving signals for driving several unit pixels in accordance with a decoded result obtained from the row decoder 1002. When the unit pixels are arranged in a matrix shape, the driving signals may be provided for respective rows.

The timing generator 1005 may provide timing and control signals to the row decoder 1002 and the column decoder 1004.

The correlated double sampler 1006 may receive the electrical signals generated from the active pixel sensor array 1001, and may hold and sample the received electrical signals. The correlated double sampler 1006 may perform a double sampling operation to sample a specific noise level and a signal level of the electrical signal, and then may output a difference level corresponding to a difference between the noise and signal levels.

The analog-to-digital converter 1007 may convert analog signals, which correspond to the difference level received from the correlated double sampler 1006, into digital signals, and then may output the converted digital signals.

The input/output buffer 1008 may latch the digital signals and then sequentially output the latched digital signals to an image signal processing unit (not shown) in response to the decoded result obtained from the column decoder 1004.

Figure 2:
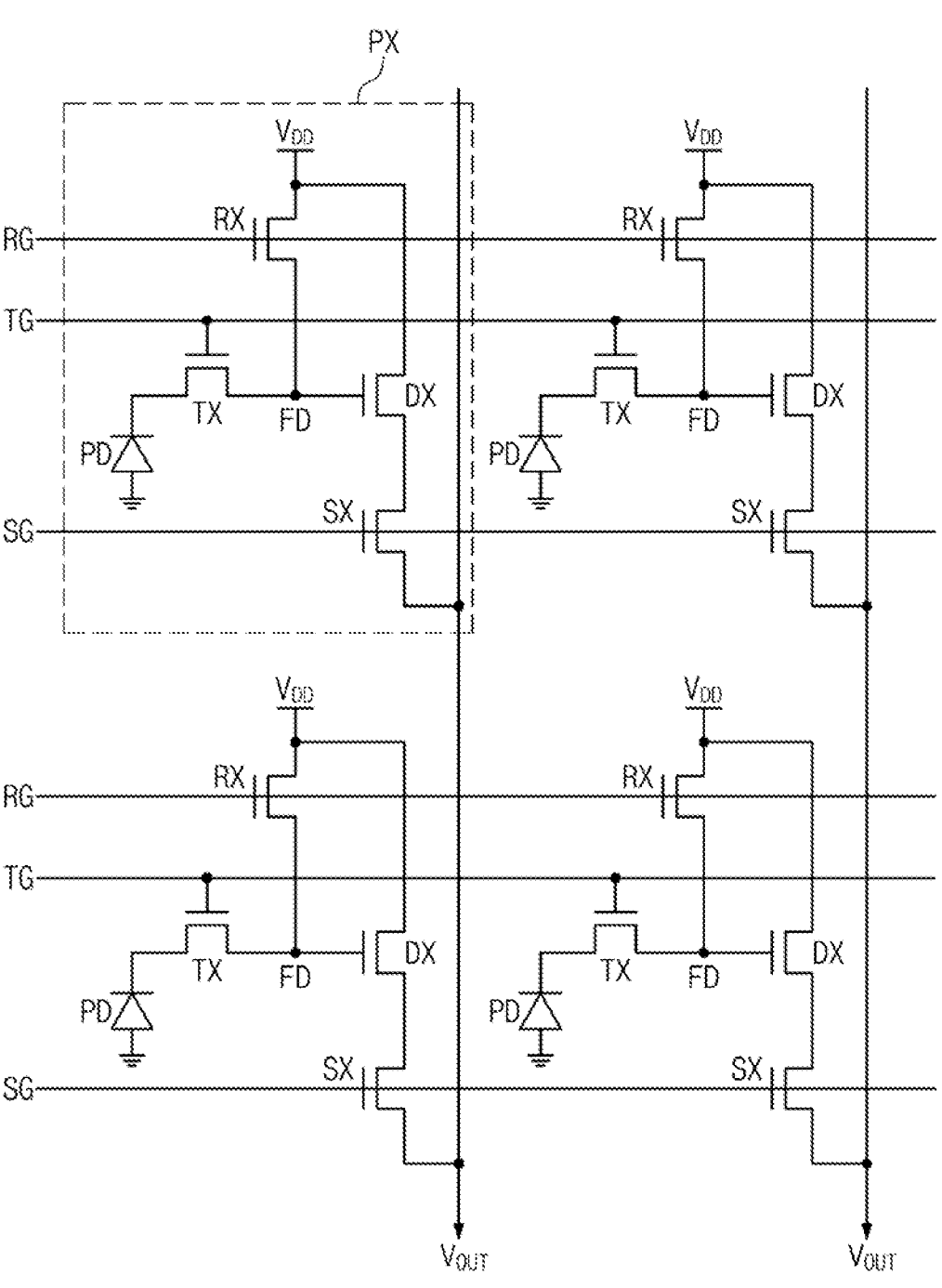
FIG. 2 illustrates a circuit diagram showing an active pixel sensor array of an image sensor according to an example embodiment.

FIG. 2 illustrates a circuit diagram showing an active pixel sensor array of an image sensor according to an example embodiment.

Referring to FIGS. 1 and 2, the active pixel sensor array 1001 may include a plurality of unit pixel regions PX, and the unit pixel regions PX may be arranged in a matrix shape. Each of the unit pixel regions PX may include a transfer transistor TX and logic transistors RX, SX, and DX. The logic transistors RX, SX, and DX may include a reset transistor RX, a selection transistor SX, and a source follower transistor DX. The transfer transistor TX may include a transfer gate electrode TG.

Each of the unit pixel regions PX may further include a photoelectric conversion element PD and a floating diffusion region FD. The photoelectric conversion element PD may create and accumulate photo-charges in proportion to an amount of externally incident light. The photoelectric conversion element PD may include a photodiode, phototransistor, a photo-gate, a pinned photodiode, or a combination thereof. The transfer transistor TX may transfer charges generated in the photoelectric conversion element PD into the floating diffusion region FD. The floating diffusion region FD may accumulate and store charges that are generated and transferred from the photoelectric conversion element PD. The source follower transistor DX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage $V_{DD}$. When the reset transistor RX is turned on, the floating diffusion region FD may be supplied with the power voltage $V_{DD}$ connected to the source electrode of the reset transistor RX. Accordingly, when the reset transistor RX is turned on, the charges accumulated in the floating diffusion region FD may be exhausted and thus the floating diffusion region FD may be reset.

The source follower transistor DX may serve as a source follower buffer amplifier. The source follower transistor DX may amplify a variation in electrical potential of the floating diffusion region FD and may output the amplified electrical potential to an output line $V_{OUT}$.

The selection transistor SX may select each row of the unit pixel regions PX to be read out. When the selection transistor SX is turned on, the power voltage $V_{DD}$ may be applied to a drain electrode of the source follower transistor DX.

Figure 3:
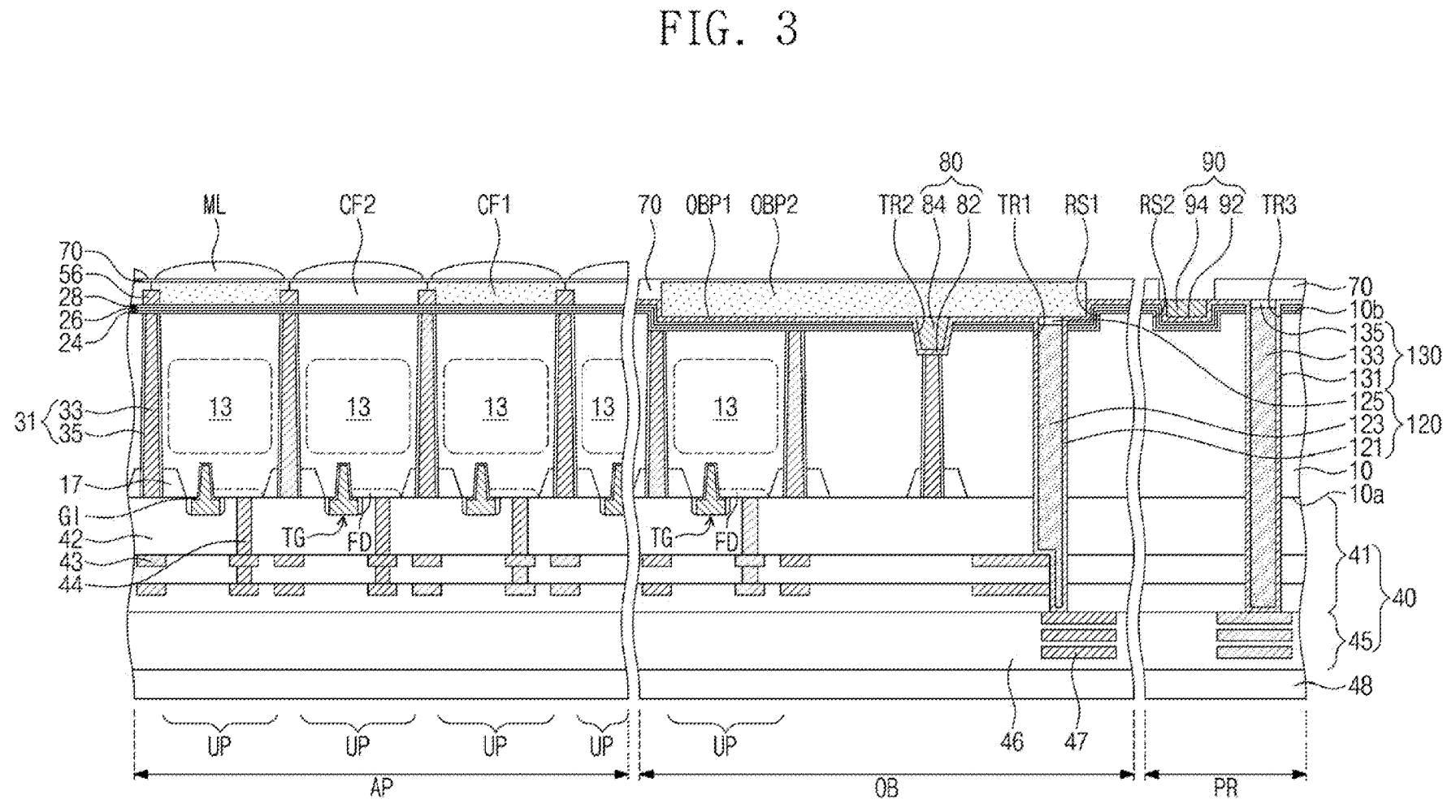
Figure 4:
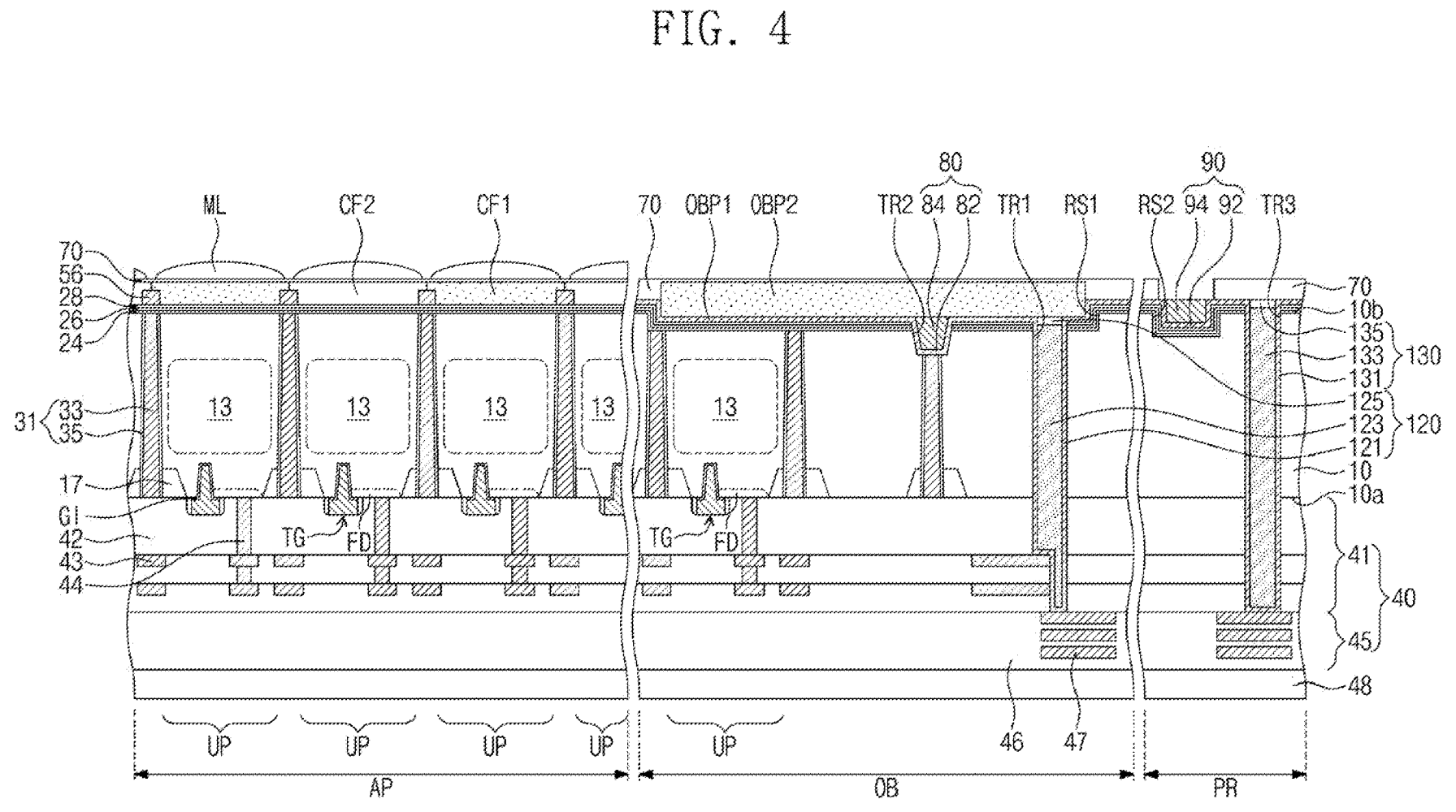
Figure 5:
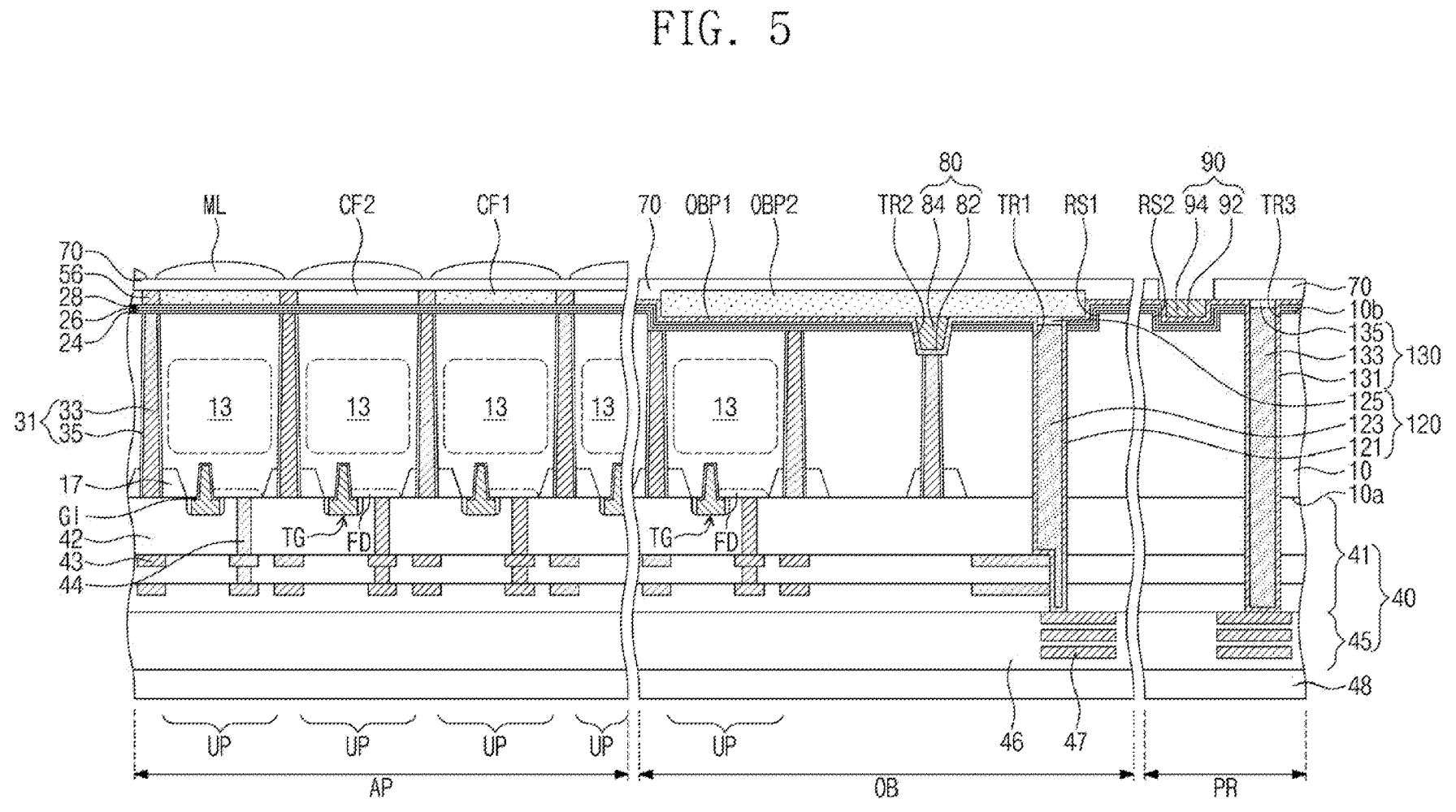
Figure 6:
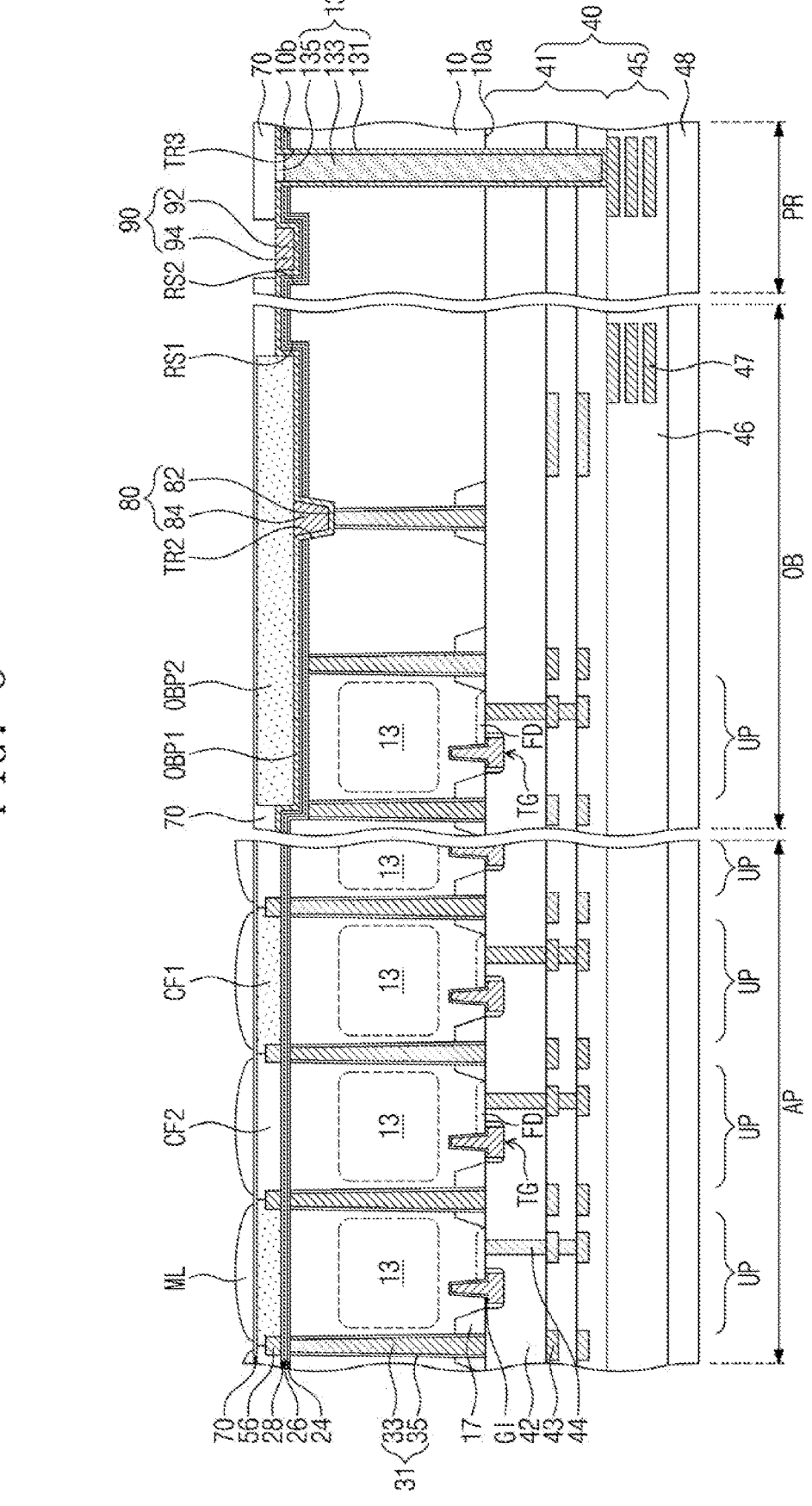

FIG. 3 illustrates a cross-sectional view showing an image sensor according to an example embodiment. FIGS. 4 to 6 illustrate cross-sectional views showing variations of the image sensor of FIG. 3 according to various example embodiments.

Referring first to FIG. 3, a substrate 10 may include a pixel area AP, an optically black area OB, and a pad area PR.

The substrate 10 may have a first surface 10a and a second surface 10b that are opposite to each other.

The substrate 10 may include a semiconductor substrate. For example, the substrate 10 may be a single-crystalline silicon substrate, a silicon epitaxial layer, or a silicon-on-insulator (SOI) substrate. The substrate 10 may be doped with impurities having a first conductivity type. For example, the first conductivity type may be p-type.

The pixel area AP may include a plurality of unit pixels UP. For example, the pixel area AP of the substrate 10 may be provided thereon with a pixel separation part 31 by which a plurality of unit pixels UP are separated from each other. The pixel separation part 31 may serve to prevent crosstalk between neighboring unit pixels UP. The pixel separation part 31 may penetrate the substrate 10 from the first surface 10a of the substrate 10 to reach the second surface 10b of the substrate 10. The pixel separation part 31 may have a net-shape structure in which lines intersect each other when viewed in a plan view. A portion of the pixel separation part 31 may be positioned on the optically black area OB. Differently from that shown, the pixel separation part 31 may have a width that is greater on the optically black area OB than on the pixel area AP.

The pixel separation part 31 may include a separation conductive pattern 33 and a separation dielectric layer 35. The separation conductive pattern 33 may vertically penetrate the substrate 10. The separation dielectric layer 35 may be interposed between the separation conductive pattern 33 and the substrate 10.

The separation conductive pattern 33 may include, for example, one or more of impurity-doped polysilicon and metal. The separation dielectric layer 35 may include, for example, silicon oxide (SiO).

At each of the unit pixels UP in pixel area AP, a photoelectric conversion part 13 may be disposed in the substrate 10. On the optically black area OB, the photoelectric conversion part 13 may also be disposed in the substrate 10.

The photoelectric conversion part 13 may be doped with impurities having a second conductivity type opposite to the first conductivity type. The second conductivity type may be, for example, n-type. The n-type impurities doped in the photoelectric conversion part 13 and the p-type impurities doped in the substrate 10 therearound may constitute a PN junction to provide a photodiode. A light ray may be incident into the substrate 10 through the second surface 10b of the substrate 10. The incident light may form electron-hole pairs in the PN junction.

Although not shown, on the pixel area AP, the first surface 10a of the substrate 10 may be provided thereon with transfer transistors for transferring electrodes generated from the incident light, reset transistors, source follower transistors, and selection transistor.

The image sensor may be a backside illumination image sensor.

A first recess RS1 and a second recess RS2 may be provided on the second surface 10b of the substrate 10. The first recess RS1 may be positioned on the optically black area OB. The second recess RS2 may be positioned on the pad area PR. The first recess RS1 and the second recess RS2 may be formed to face toward the first surface 10a from the second surface 10b of the substrate 10. The first recess RS1 may be upwardly spaced apart from the photoelectric conversion part 13 on the optically black area OB. On the optically black area OB, the first recess RS1 may be a section where optically black patterns OBP1 and OBP2 are provided. On the pad area PR, the second recess RS2 may be a section where a conductive pad 90 is provided.

The first recess RS1 and the second recess RS2 may have their bottom surfaces located at the same level.

In another implementation, referring to FIG. 4, the bottom surface of the first recess RS1 may be located at a higher level than that of the bottom surface of the second recess RS2.

The following description will continue to focus on the example embodiment of FIG. 3.

A device isolation pattern 17 may be disposed adjacent to the first surface 10a of the substrate 10. The device isolation pattern 17 may define active regions on each unit pixel UP on the pixel area AP.

The device isolation pattern 17 may include, for example, a single-layered or multi-layered structure of at least one selected from silicon oxide (SiO), silicon nitride (SiN), and silicon oxynitride (SiON).

A transfer gate electrode TG may be disposed on a portion of the active regions. The transfer gate electrode TG may correspond to a gate of the transfer transistor TX depicted in FIG. 2. A portion of the transfer gate electrode TG may be inserted into the substrate 10. Another portion of the transfer gate electrode TG may protrude outwardly from and may cover the first surface 10a of the substrate 10. The transfer gate electrode TG may be a vertical type gate.

On the active region, a floating diffusion region FD may be disposed on a side of the transfer gate electrode TG. The floating diffusion region FD may be disposed in the substrate 10.

The floating diffusion region FD may be doped with impurities having, for example, the second conductivity type.

Although not shown, a circuit gate electrode may be disposed on another portion of the active regions. For example, a circuit gate electrode (not shown) may be disposed on another portion of the active regions, and the circuit gate electrode may correspond to one of a reset gate of the reset transistor RX depicted in FIG. 2, a source follower gate of the source follower transistor DX depicted in FIG. 2, and a selection gate of the selection transistor SX depicted in FIG. 2. A plurality of neighboring unit pixels UP may share, and transfer charges to, at least one of the reset gate of the reset transistor RX, the source follower gate of the source follower transistor DX, and the selection gate of the selection transistor SX. The circuit gate electrode may not be inserted into the substrate 10. The circuit gate electrode may be a planar type gate positioned on the first surface 10a of the substrate 10. The other portion of the active region, where the circuit gate electrode is disposed, may have therein source/drain regions located on opposite sides of the circuit gate electrode. The source/drain regions may be doped with impurities, for example, having the second conductivity type.

A gate dielectric layer GI may be interposed between the transfer gate electrode TG and the substrate 10 and between the circuit gate electrode and the substrate 10.

The gate dielectric layer GI may include, for example, silicon oxide (SiO) or silicon nitride (SiN).

A wiring layer 40 may be disposed on the first surface 10a of the substrate 10. The wiring layer 40 may include an upper wiring layer 41 and a lower wiring layer 45.

The upper wiring layer 41 may include a first interlayer dielectric layer 42 and first wiring lines 43. The first surface 10a of the substrate 10 may be covered with the first interlayer dielectric layer 42. On the first surface 10a of the substrate 10, the first interlayer dielectric layer 42 may cover the transfer gate electrode TG and the circuit gate electrode.

The first interlayer dielectric layer 42 may include, for example, a multi-layered structure of at least one selected from silicon oxide (SiO), silicon nitride (SiN), silicon oxynitride (SiON), silicon carbonitride (SiCN), tetraethylorthosilicate (TEOS), and porous dielectric.

The first interlayer dielectric layer 42 may be provided therein with the multi-layered first wiring lines 43.

The first wiring line 43 may be positioned on the pixel area AP. The floating diffusion region FD may be connected through a contact plug 44 to the first wiring line 43. The contact plug 44 may penetrate the first interlayer dielectric layer 42 on the pixel area AP.

A portion of the first wiring line 43 may also be positioned on the optically black area OB. For example, the first wiring line 43 may be disposed below the photoelectric conversion part 13 on the pixel area AP and the optically black area OB.

In other implementations, the first wiring line 43 may be disposed at various positions.

The lower wiring layer 45 may be disposed below the upper wiring layer 41. The lower wiring layer 45 may include a second interlayer dielectric layer 46 and second wiring lines 47. A bottom surface of the upper wiring layer 41 may be covered with the second interlayer dielectric layer 46.

The second interlayer dielectric layer 46 may include, for example, a multi-layered structure of at least one selected from silicon oxide (SiO), silicon nitride (SiN), silicon oxynitride (SiON), silicon carbonitride (SiCN), tetraethylorthosilicate (TEOS), and porous dielectric.

The second interlayer dielectric layer 46 may be provided therein with the multi-layered second wiring lines 47. The second wiring lines 47 may be positioned on the pad area PR.

A portion of the second wiring line 47 may also be positioned on the optically black area OB. For example, the second wiring line 47 may be disposed on the pad area PR, and on the optically black area OB, may be disposed below a section where the photoelectric conversion part 13 is not provided.

In other implementations, the second wiring lines 47 may be disposed on various positions.

The lower wiring layer 45 may be covered with a first protection layer 48.

The first protection layer 48 may include, for example, silicon oxide (SiO) or polyimide.

A first fixed charge layer 24 may be disposed on the second surface 10b of the substrate 10. The second surface 10b may be in contact with the first fixed charge layer 24. The first fixed charge layer 24 may cover the second surface 10b of the substrate 10 on the pixel area AP, may cover the second surface 10b of the substrate 10 on the optically black area OB and conformally cover an inner lateral surface of the first recess RS1, and may cover the second surface 10b of the substrate 10 on the pad area PR and conformally cover an inner lateral surface of the second recess RS2.

The first fixed charge layer 24 may be formed of a single layer or multiple layers of a metal oxide layer or a metal fluoride layer including less oxygen or fluorine than the stoichiometric ratio. The first fixed charge layer 24 may thus have a negative fixed charge. The first fixed charge layer 24 may be formed of metal oxide or metal fluoride that includes at least one metal selected from hafnium (Hf), zirconium (Zr), aluminum (Al), tantalum (Ta), titanium (Ti), yttrium (Y), and lanthanoid. For example, the first fixed charge layer 24 may include one or more of a hafnium oxide (HfO) layer and an aluminum oxide ($Al_2O_3$) layer.

The first fixed charge layer 24 may suppress or reduce dark current and white spot.

A second fixed charge layer 26 and a second protection layer 28 may be sequentially stacked on the first fixed charge layer 24. The second fixed charge layer 26 and the second protection layer 28 may conformally cover the first fixed charge layer 24 on the pixel area AP, the optically black area OB, and the pad area PR. The second fixed charge layer 26 may include a single layer or multiple layers including metal oxide or metal fluoride.

The second fixed charge layer 26 may include, for example, one or more of a hafnium oxide (HfO) layer and an aluminum oxide ($Al_2O_3$) layer.

The second fixed charge layer 26 may reinforce the first fixed charge layer 24 or may serve as an adhesion layer.

The second protection layer 28 may include at least one selected from plasma-enhanced tetraethylorthosilicate (PE-TEOS), silicon oxide (SiO), silicon nitride (SiN), silicon carbonitride (SiCN), hafnium oxide (HfO), and aluminum oxide ($Al_2O_3$).

The second protection layer 28 may serve as one or more of an antireflection layer and a planarization layer.

On the pixel area AP, a light-shield grid pattern 56 may be disposed on the second protection layer 28. The light-shield grid pattern 56 may overlap the pixel separation part 31 and may constitute a net shape when viewed in a plan view.

The light-shield grid pattern 56 may include metal, such as titanium (Ti) or tungsten (W).

Although not shown, a low-refractive pattern may be formed on the light-shield grid pattern 56. The low-refractive pattern may have a planar shape the same as that of the light-shield grid pattern 56. For example, the low-refractive pattern may have a sidewall aligned with that of the light-shield grid pattern 56. The low-refractive pattern may include an organic material. The low-refractive pattern may have a refractive index less than those of color filters CF1 and CF2 which will be discussed below. For example, the low-refractive pattern may have a refractive index of equal to or less than about 1.3. The light-shield grid pattern 56 and the low-refractive pattern may prevent crosstalk between neighboring unit pixels UP.

FIG. 3 depicts that the light-shield grid pattern 56 is provided only on the pixel area AP, but a portion of the light-shield grid pattern 56 may also be positioned on the optically black area OB. In this case, the light-shield grid pattern 56 may not extend into the first recess RS1.

The following description will continue to focus on the example embodiment of FIG. 3.

On the pixel area AP, color filters CF1 and CF2 may be disposed in sections formed by the light-shield grid pattern 56. The color filters CF1 and CF2 may each have one of blue, green, and red colors. The color filters CF1 and CF2 may be arranged in one of Bayer pattern, 2×2 Tetra pattern, and 3×3 Nona pattern. Alternatively, the color filters CF1 and CF2 may include different colors such as cyan, magenta, or yellow.

The color filters CF1 and CF2 may have their top surfaces at a higher level than that of a top surface of the light-shield grid pattern 56. For example, neighboring color filters CF1 and CF2 may be in contact with each other on the light-shield grid pattern 56 therebetween.

In another implementation, referring to FIG. 5, the top surfaces of the color filters CF1 and CF2 may be located at the same level as that of the top surface of the light-shield grid pattern 56. For example, the color filters CF1 and CF2 may be provided only within a section defined by the light-shield grid pattern 56.

The following description will continue to focus on the example embodiment of FIG. 3.

On the pixel area AP, a microlens array layer ML may be disposed on the color filters CF1 and CF2. The microlens array layer ML may include convex lenses that correspondingly overlap the unit pixels UP.

On the optically black area OB, the substrate 10 may be provided thereon with a first connection structure 120, a connection contact 80, and optically black patterns OBP1 and OBP2.

The first connection structure 120 may be a via plug that connects the first optically black pattern OBP1 to the first wiring lines 43 of the upper wiring layer 41 and/or to the second wiring lines 47 of the lower wiring layer 45. The first connection structure 120 may fill a first trench TR1 formed in the substrate 10 on the optically black area OB.

When viewed in a plan view, the first trench TR1 may be formed within the first recess RS1. For example, the first trench TR1 may extend into the substrate 10 from the bottom surface of the first recess RS1. In this case, within the first recess RS1, the first trench TR1 may penetrate the first fixed charge layer 24, the second fixed charge layer 26, and the second protection layer 28 to thereby extend into the substrate 10. The first trench TR1 may penetrate the substrate 10 and the upper wiring layer 41 to expose top and/or lateral surfaces of certain first wiring lines 43. On sides of the certain first wiring layers 443, a portion of the first trench TR1 may penetrate the substrate 10, the upper wiring layer 41, and the lower wiring layer 45 to expose a top surface of a certain second wiring line 47.

The first connection structure 120 may include a first conductive pattern 121, a first dielectric pattern 123, and a first capping pattern 125.

The first conductive pattern 121 may conformally cover an inner wall of the first trench TR1. The first conductive pattern 121 may penetrate the substrate 10 and the upper wiring layer 41 to connect the substrate 10 and the wiring layer 40 to each other. The first conductive pattern 121 may be in contact with wiring lines in the upper and lower wiring layers 41 and 45. For example, the first conductive pattern 121 may be in contact with the certain first wiring lines 43 and the certain second wiring lines 47 exposed by the first trench TR1. Therefore, the first conductive pattern 121 may be electrically connected to the wiring lines 43 and 47 in the wiring layer 40.

The first conductive pattern 121 may include a metallic material, such as tungsten (W).

The first dielectric pattern 123 may fill an unoccupied portion of the first trench TR1. The first dielectric pattern 123 may entirely or partially penetrate the substrate 10 and the wiring layer 40.

The first capping pattern 125 may be provided on a top surface of the first dielectric pattern 123. The first capping pattern 125 may be provided on the first dielectric pattern 123.

The connection contact 80 may fill a second trench TR2 formed in the substrate 10 on the optically black area OB.

When viewed in a plan view, the second trench TR2 may be formed within the first recess RS1. For example, the second trench TR2 may extend into the substrate 10 from the bottom surface of the first recess RS1. The second trench TR2 may be horizontally spaced apart from the first trench TR1. The second trench TR2 may be formed on the pixel separation part 31 on the optically black area OB. In this case, within the first recess RS1, the second trench TR2 may penetrate the first fixed charge layer 24, the second fixed charge layer 26, and the second protection layer 28. The second trench TR2 may penetrate the substrate 10 to expose the separation conductive pattern 33 of the pixel separation part 31.

The connection contact 80 may penetrate the first fixed charge layer 24, the second fixed charge layer 26, the second protection layer 28, and a portion of the substrate 10 to thereby contact the separation conductive pattern 33 of the pixel separation part 31. The connection contact 80 may include a first contact pattern 82 that conformally covers an inner sidewall and a bottom surface of the second trench TR2, and may also include a second contact pattern 84 that lies on the first contact pattern 82 and fills the second trench TR2.

The first contact pattern 82 may include, for example, tungsten (W). The second contact pattern 84 may include, for example, aluminum (Al).

On the optically black area OB, the first optically black pattern OBP1 may be provided on the second protection layer 28.

The first optically black pattern OBP1 may conformally cover the second protection layer 28 in the first recess RS1. For example, on the second protection layer 28, the first optically black pattern OBP1 may extend along the bottom surface and an inner sidewall of the first recess RS1. As the first connection structure 120 and the connection contact 80 are provided to penetrate the first fixed charge layer 24, the second fixed charge layer 26, and the second protection layer 28, the first conductive pattern 121 of the first connection structure 120 and the first contact pattern 82 of the connection contact 80 may be connected to the first optically black pattern OBP1 on the bottom surface of the first recess RS1.

The connection contact 80 may be connected to the wiring layer 40 through the first optically black pattern OBP1 and the first connection structure 120. In this case, the first optically black pattern OBP1, the first conductive pattern 121, and the first contact pattern 82 may include the same material, and may be integrally formed into a single unitary body.

The first optically black pattern OBP1, the first conductive pattern 121, and the first contact pattern 82 may have the same thickness. For example, on the second protection layer 28, the first conductive pattern 121 of the first connection structure 120 and the first contact pattern 82 of the connection contact 80 may extend along the bottom surface and the inner sidewall of the first recess RS1, and may be connected to each other on the bottom surface of the first recess RS1.

The first optically black pattern OBP1 may be defined to indicate a portion of the first contact pattern 82 and a portion of the first conductive pattern 121 positioned on the bottom surface and the inner sidewall of the first recess RS1.

The first optically black pattern OBP1 may include a different material from those of the color filters CF1 and CF2 and that of the second optically black pattern OBP2. For example, the first optically black pattern OBP1, the first conductive pattern 121, and the first contact pattern 82 may include tungsten (W).

On the optically black area OB, the first optically black pattern OBP1 may serve to block light. A reference amount of charges may be defined to indicate an amount of charges detected in the optically black area OB in a light-blocked state. For example, amounts of unit pixel charges detected from the unit pixels UP and the reference amount of charges may be compared to calculate differences between the amount of unit pixel charges and the reference amount of charges, and thus it may be possible to obtain the magnitude of an electrical signal detected from each unit pixel UP.

On the optically black area OB, a second optically black pattern OBP2 may be disposed on the first optically black pattern OBP1. The second optically black pattern OBP2 may overlap the first optically black pattern OBP1.

The second optically black pattern OBP2 may fill an unoccupied portion of the first recess RS1. Therefore, the first optically black pattern OBP1 may cover bottom and lateral surfaces of the second optically black pattern OBP2. A top surface of the second optically black pattern OBP2 may be located at the same level as that of the top surfaces of the color filters CF1 and CF2. The top surface of the second optically black pattern OBP2 may be substantially flat. For example, the top surface of the second optically black pattern OBP2 may be positioned on the same plane on which the top surfaces of the color filters CF1 and CF2 are positioned.

In another implementation, referring to FIG. 5, when the top surfaces of the color filters CF1 and CF2 are located at the same level as that of the top surface of the light-shield grid pattern 56, the top surface of the second optically black pattern OBP2 may also be located at the same level as that of the top surface of the light-shield grid pattern 56.

Based on positions of the top surfaces of the color filters CF1 and CF2, the top surface of the second optically black pattern OBP2 may be located at a level that is the same as or higher than that of an uppermost surface of the second protection layer 28.

When the top surface of the second optically black pattern OBP2 is located at a higher level than that of the uppermost surface of the second protection layer 28, the first optically black pattern OBP1 may cover a portion of the bottom surface of the second optically black pattern OBP2.

Alternatively, when the top surface of the second optically black pattern OBP2 is located at the same level as that of the uppermost surface of the second protection layer 28, the first optically black pattern OBP1 may entirely cover the lateral surface of the second optically black pattern OBP2.

In an implementation, a top end of the first optically black pattern OBP1 may be located at a level that is the same as or lower than that of the top surface of the second optically black pattern OBP2.

The second optically black pattern OBP2 may include the same material as that of one of the color filters CF1 and CF2. For example, the second optically black pattern OBP2 may have a blue color. The second optically black pattern OBP2 may be a photoresist pattern including a blue pigment. Identical to the first optically black pattern OBP1, the second optically black pattern OBP2 may also serve to block light. The second optically black pattern OBP2 may supplement a light-shield function of the first optically black pattern OBP1.

As described above, according to an example embodiment, the top surfaces of the color filters CF1 and CF2 on the pixel area AP may be located on the same plane on which is located the top surface of the second optically black pattern OBP2 on the optically black area OB. Therefore, in the vicinity of a boundary between the pixel area AP and the optically black area OB, no step difference may be present between the second optically black pattern OBP2 and the color filters CF1 and CF2, and a top end of an image sensor may be substantially flat on the pixel area AP and the optically black area OB. Accordingly, the image sensor may increase in structural stability. In addition, because no step difference may be present between the second optically black pattern OBP2 and the color filters CF1 and CF2 in the vicinity of a boundary between the pixel area AP and the optically black area OB, a process may be easily performed after the formation of the color filters CF1 and CF2 and the second optically black pattern OBP2. This will be discussed in detail below, in explaining a method of fabricating an image sensor.

Referring still to FIG. 3, although not shown, a passivation layer may be interposed between the first optically black pattern OBP1 and the second optically black pattern OBP2.

A second connection structure 130 and a conductive pad 90 may be provided on the substrate 10 on the pad area PR.

The second connection structure 130 may be a via plug that connects the conductive pad 90 to the second wiring lines 47 of the lower wiring layer 45. The second connection structure 130 may fill a third trench TR3 formed in the substrate 10 on the pad area PR. The third trench TR3 may extend into the substrate 10 from the second surface 10b of the substrate 10. In this case, the third trench TR3 may penetrate the first fixed charge layer 24, the second fixed charge layer 26, and the second protection layer 28. The third trench TR3 may penetrate the substrate 10, the upper wiring layer 41, and the lower wiring layer 45 to expose a top surface of a certain second wiring line 47. The second connection structure 130 may include a second conductive pattern 131, a second dielectric pattern 133, and a second capping pattern 135.

The second conductive pattern 131 may conformally cover an inner wall of the third trench TR3. The second conductive pattern 131 may penetrate the substrate 10 and the upper wiring layer 41 to connect the substrate 10 and the wiring layer 40 to each other. The second conductive pattern 131 may be in contact with wiring lines in the upper and lower wiring layers 41 and 45. For example, the second conductive pattern 131 may be in contact with the certain second wiring lines 47 exposed by the third trench TR3. Therefore, the second conductive pattern 131 may be electrically connected to wiring lines in the wiring layer 40.

The second conductive pattern 131 may include a metallic material, such as tungsten (W).

The second dielectric pattern 133 may fill an unoccupied portion of the third trench TR3. The second dielectric pattern 133 may entirely or partially penetrate the substrate 10 and the wiring layer 40.

The second capping pattern 135 may be provided on a top surface of the second dielectric pattern 133. The second capping pattern 135 may be provided on the second dielectric pattern 133.

On the pad area PR, the conductive pad 90 may be provided on the second protection layer 28. For example, on the second protection layer 28, the conductive pad 90 may fill the second recess RS2. A bottom surface of the conductive pad 90 may be located at the same level as a bottom surface of the first optically black pattern OBP1. In this description, the bottom surface of the first optically black pattern OBP1 may be a surface positioned on the bottom surface of the first recess RS1 among surfaces that face lower sides of the first optically black pattern OBP1, and may be irrelevant to a bottom surface of the first conductive pattern 121 connected to the first optically black pattern OBP1 and to a bottom surface of the first contact pattern 82.

In another implementation, referring to FIG. 4, when the bottom surface of the second recess RS2 is located lower than that of the first recess RS1, the bottom surface of the conductive pad 90 may be located at a lower level than that of the bottom surface of the first optically black pattern OBP1.

A depth of the second recess RS2 may be variously changed based on a resistance of the conductive pad 90.

The following description will continue to focus on the example embodiment of FIG. 3.

The conductive pad 90 may include a first pad pattern 92 that conformally covers the inner sidewall and a bottom surface of the second recess RS2, and may also include a second pad pattern 94 that lies on the first pad pattern 92 and fills the second recess RS2.

The first pad pattern 92 may include, for example, tungsten (W). The second pad pattern 94 may include, for example, aluminum (Al).

The conductive pad 90 may be electrically connected to the second connection structure 130. For example, the first pad pattern 92 of the conductive pad 90 and the second conductive pattern 131 of the second connection structure 130 may extend onto and connect to each other on the second surface 10b of the substrate 10.

The first pad pattern 92 and the second conductive pattern 131 may include the same material and may constitute a single unitary body. The first pad pattern 92 and the second conductive pattern 131 may have the same thickness.

The first pad pattern 92 of the conductive pad 90 may extend toward a different area and may form an electrical connection. For example, the first pad pattern 92 of the conductive pad 90 may extend toward the optically black area OB, and the first optically black pattern OBP1 may extend toward the pad area PR, which may provide a connection between the first pad pattern 92 and the first optically black pattern OBP1.

In another implementation, referring to FIG. 6, the first connection structure 120 may not be provided. In this case, the conductive pad 90 may be connected to the lower wiring layer 45 through the second connection structure 130, and may be connected to the upper wiring layer 41 through the first pad pattern 92 that extends onto the optically black area OB and the connection contact 80 connected to the first pad pattern 92.

The following description will continue to focus on the example embodiment of FIG. 3.

A planarization pattern 70 may be disposed between the microlens array layer ML and the second protection layer 28. The color filters CF1 and CF2 may be positioned between the planarization pattern 70 and the microlens array layer ML. The second optically black pattern OBP2 may be positioned between the planarization pattern 70 and the second protection layer 28. For example, on the second protection layer 28, the planarization pattern 70 may cover the second optically black pattern OBP2 and the color filters CF1 and CF2.

The top surface of the second optically black pattern OBP2 may be located at the same level as that of the top surfaces of the color filters CF1 and CF2. Therefore, a top surface of the planarization pattern 70 may be flat on the pixel area AP and the optically black area OB. On the pad area PR, the planarization pattern 70 may have an opening that exposes the conductive pad 90.

The planarization pattern 70 may be formed of a transparent thermosetting resin or a photoresist material the same as or similar to that of the microlens array layer ML.

In another implementation, the planarization pattern 70 may not be provided.

Figure 7:
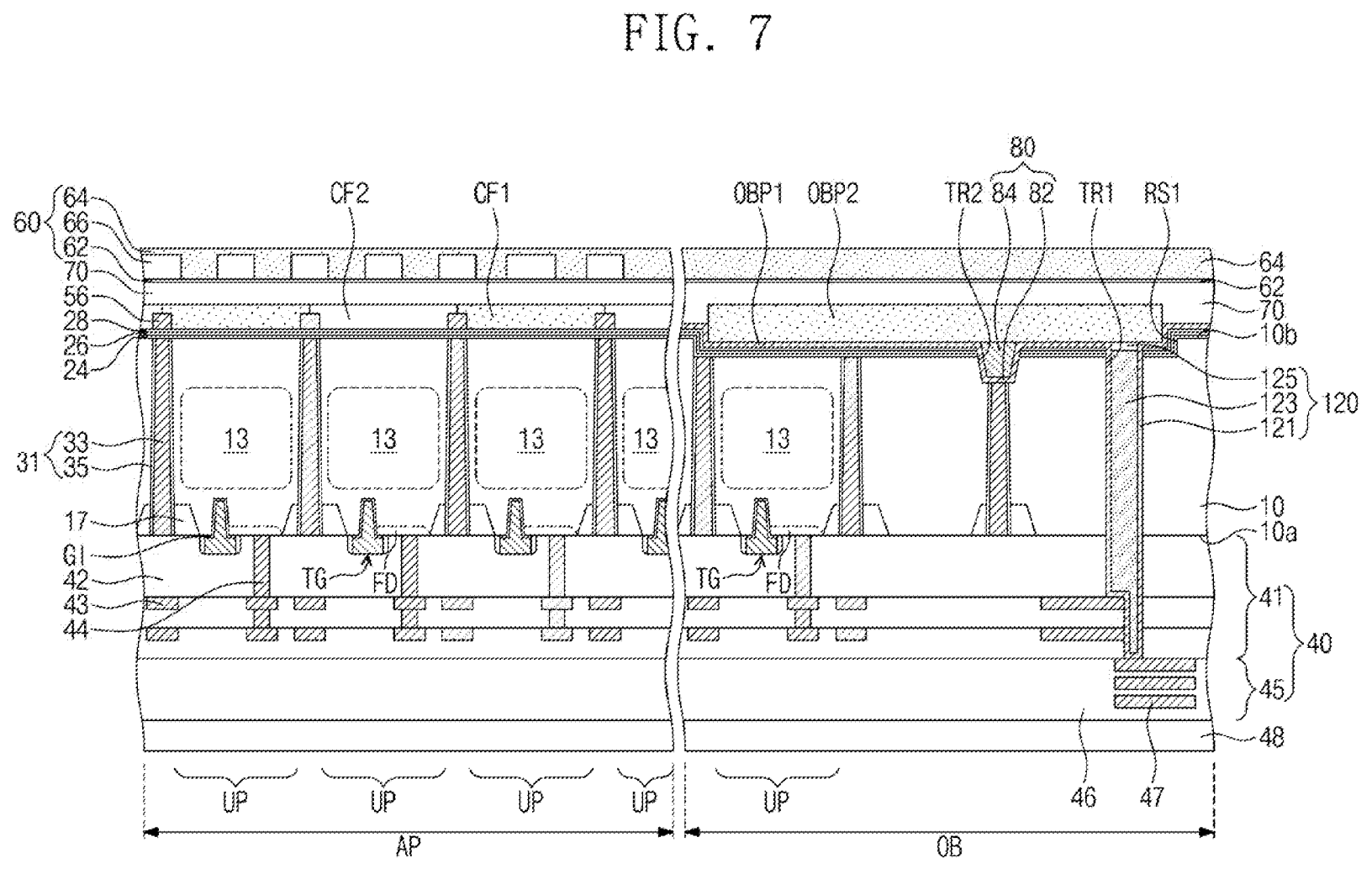
Figure 8:
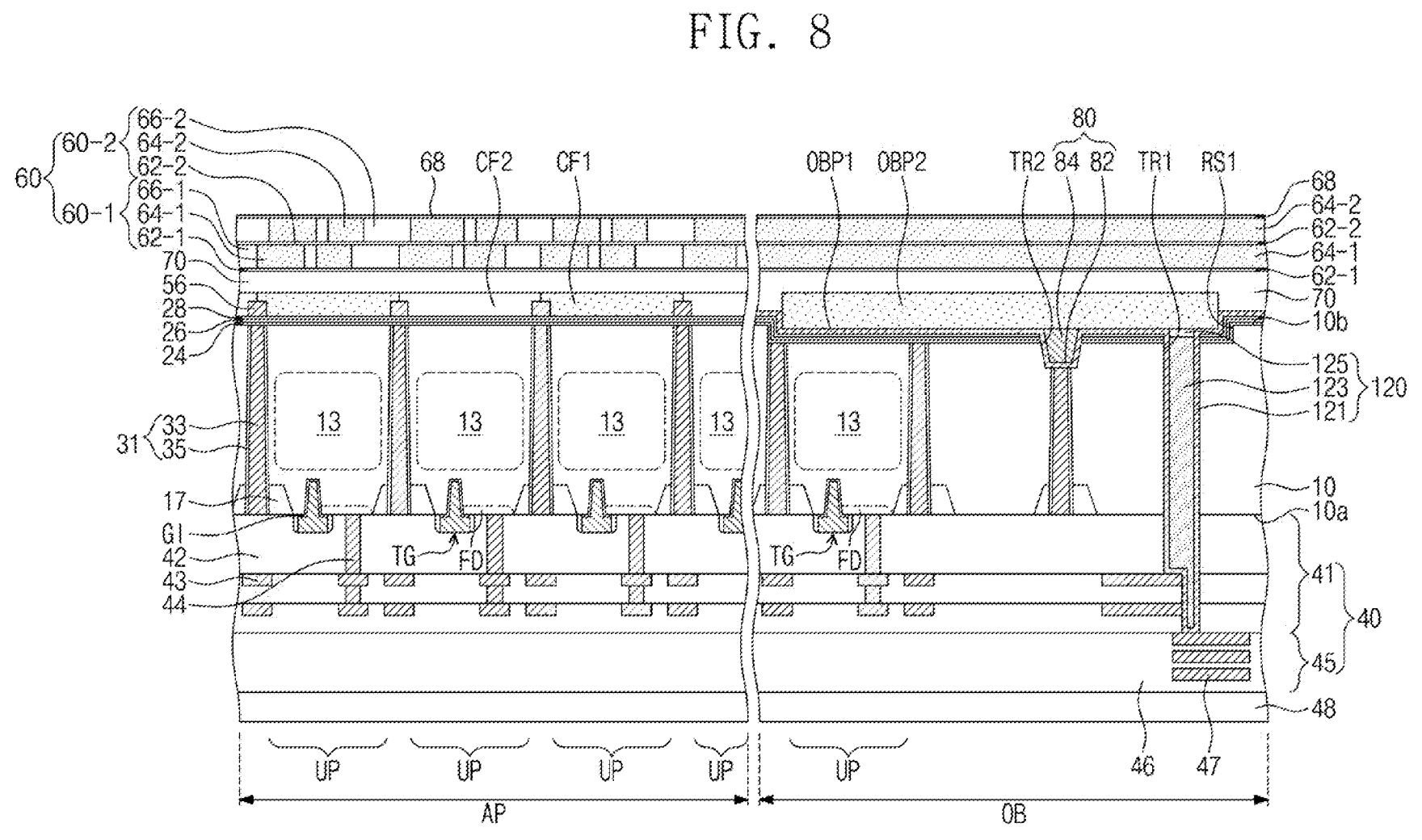

FIGS. 7 and 8 illustrate cross-sectional views showing an image sensor according to respective example embodiments.

In FIGS. 7 and 8, an illustration of the pad area PR is omitted for convenience of description. In the embodiments that follow, components the same as those discussed with reference to FIGS. 1 to 6 are allocated the same reference numerals thereto, and a repetitive explanation thereof will be omitted or abridged for convenience of description. The following description will focus on differences between the embodiments of FIGS. 1 to 6 and other embodiments described below.

FIG. 7 depicts an example of a single-layered color separation lens array layer 60.

Referring to FIG. 7, a first recess RS1 may be provided on the second surface 10b of the substrate 10. The first recess RS1 may be positioned on the optically black area OB. The first recess RS1 may be formed directed from the second surface 10b toward the first surface 10a of the substrate 10.

A first fixed charge layer 24 may be disposed on the second surface 10b of the substrate 10. The second surface 10b may be in contact with the first fixed charge layer 24. On the pixel area AP, the first fixed charge layer 24 may cover the second surface 10b of the substrate 10, and on the optically black area OB, the first fixed charge layer 24 may cover the second surface 10b of the substrate 10 and conformally cover an inner lateral surface of the first recess RS1.

A second fixed charge layer 26 and a second protection layer 28 may be sequentially stacked on the first fixed charge layer 24. The second fixed charge layer 26 and the second protection layer 28 may conformally cover the first fixed charge layer 24 on the pixel area AP and the optically black area OB.

On the pixel area AP, a light-shield grid pattern 56 may be disposed on the second protection layer 28. The light-shield grid pattern 56 may overlap the pixel separation part 31 and may constitute a net shape when viewed in a plan view.

On the pixel area AP, color filters CF1 and CF2 may be disposed in sections formed by the light-shield grid pattern 56.

On the optically black area OB, the substrate 10 may be provided thereon with a first connection structure 120, a connection contact 80, and optically black patterns OBP1 and OBP2.

The first connection structure 120 may be a via plug that connects the first optically black pattern OBP1 to the first wiring lines 43 of the upper wiring layer 41 and/or to the second wiring lines 47 of the lower wiring layer 45. The first connection structure 120 may fill a first trench TR1 formed in the substrate 10 on the optically black area OB. Within the first recess RS1, the first trench TR1 may penetrate the first fixed charge layer 24, the second fixed charge layer 26, and the second protection layer 28 to thereby extend into the substrate 10. The first connection structure 120 may include a first conductive pattern 121, a first dielectric pattern 123, and a first capping pattern 125.

The connection contact 80 may fill a second trench TR2 formed in the substrate 10 on the optically black area OB. Within the first recess RS1, the second trench TR2 may penetrate the first fixed charge layer 24, the second fixed charge layer 26, and the second protection layer 28. The second trench TR2 may be horizontally spaced apart from the first trench TR1. The connection contact 80 may penetrate the first fixed charge layer 24, the second fixed charge layer 26, the second protection layer 28, and a portion of the substrate 10 to thereby contact the separation conductive pattern 33 of the pixel separation part 31. The connection contact 80 may include a first contact pattern 82 and a second contact pattern 84.

On the optically black area OB, a first optically black pattern OBP1 may be provided on the second protection layer 28. The first optically black pattern OBP1 may conformally cover the second protection layer 28 in the first recess RS1. On a bottom surface of the first recess RS1, the first conductive pattern 121 of the first connection structure 120 and the first contact pattern 82 of the connection contact 80 may be connected to the first optically black pattern OBP1. The first optically black pattern OBP1 may include a different material from those of the color filters CF1 and CF2 and that of the second optically black pattern OBP2.

On the optically black area OB, the second optically black pattern OBP2 may be disposed on the first optically black pattern OBP1. The second optically black pattern OBP2 may overlap the first optically black pattern OBP1. The second optically black pattern OBP2 may fill an unoccupied portion of the first recess RS1. A top surface of the second optically black pattern OBP2 may be located at the same level as that of top surfaces of the color filters CF1 and CF2. The top surface of the second optically black pattern OBP2 may be positioned on the same plane on which the top surfaces of the color filters CF1 and CF2 are positioned.

The second optically black pattern OBP2 may include the same material as that of one of the color filters CF1 and CF2.

A planarization pattern 70 may be disposed on the second protection layer 28. On the second protection layer 28, the planarization pattern 70 may cover the second optically black pattern OBP2 and the color filters CF1 and CF2. The top surface of the second optically black pattern OBP2 may be located at the same level as that of the top surfaces of the color filters CF1 and CF2. Therefore, a top surface of the planarization pattern 70 may be flat on the pixel area AP and the optically black area OB.

The planarization pattern 70 may be formed of a dielectric material, such as silicon oxide (SiO) or siloxane-based spin on glass (SOG), whose absorptance is low in a visible light range while having a refractive index less than that of first nano-posts 66 of a color separation lens array layer 60 which will be discussed below.

A color separation lens array layer 60 may be provided on the planarization pattern 70. The color separation lens array layer 60 may have a third protection layer 62, a first dielectric layer 64, and first nano-posts 66.

The third protection layer 62 may cover the planarization pattern 70. The third protection layer 62 may have a flat top surface.

The third protection layer 62 may include aluminum oxide ($Al_2O_3$).

On the pixel area AP, the first nano-posts 66 may be disposed on the third protection layer 62. The first nano-posts 66 may not be provided on the optically black area OB.

The first nano-posts 66 may be arranged at a certain rule on the third protection layer 62. In this description, the rule may be applicable to parameters such as shape, size (e.g., width and height), interval, and arrangement type of the first nano-posts 66, and may be determined in accordance with a target phase distribution that the color separation lens array layer 60 is intended to achieve with respect to incident light. The target phase distribution may be determined in consideration of a target region on which the incident light is separated in wavelength and focused. The target phase distribution may indicate a phase distribution on a position immediately after the incident light has passed through the color separation lens array layer 60, for example, on either a lower surface of the color separation lens array layer 60 or an upper surface of the third protection layer 62.

The color separation lens array layer 60 may have sections correspondingly positioned on the color filters CF1 and CF2. For example, the sections of the color separation lens array layer 60 may be positioned to one-to-one correspond to the color filters CF1 and CF2. Each of the sections may include a single or a plurality of first nano-posts 66. FIG. 7 depicts that three first nano-posts 66 overlap the section, but this may be varied. In addition, the first nano-posts 66 may be disposed on boundaries between the sections, or differently from that shown, the first nano-posts 66 may be entirely positioned in the sections.

The first nano-posts 66 may form a phase distribution obtained when rays having different wavelengths included in the incident light are branched in different directions and are condensed. For example, the first nano-posts 66 distributed on the sections may be determined in terms of shape, size, and arrangement so as to form a target phase where light having a first wavelength included in the incident light has a first phase distribution and light having a second wavelength included in the incident light has a second phase distribution. The target phase distribution may cause the first-wavelength light and the second-wavelength light to concentrate on a target position (e.g., the photoelectric conversion part 13 or the color filter CF1 or CF2) spaced apart at a certain distance from an array of the first nano-posts 66. Wavelengths of rays branched by the first nano-posts 66 may correspond to target wavelengths of the color filters CF1 and CF2 on which the rays are concentrated. There may be a variation in rule at which the first nano-posts 66 are arranged on the sections. The nano-posts 66 may have a size less than a wavelength range that is a branch target. For example, when the incident light is visible light, the first nano-posts 66 may each have a size (e.g., width or height) less than about 400 nm.

The first nano-posts 66 may be formed of a material whose refractive index is greater than that of the third protection layer 62 or the first dielectric layer 64. For example, the first nano-posts 66 may be formed of one or more of c-Si, p-Si, a-Si, III-V compound semiconductor (e.g., GaP, GaN, or GaAs), SiC, TiO$_2$, SiN, and any combination thereof. The third protection layer 62 or the first nano-posts 66 whose refractive index is different from that of the first dielectric layer 64 may change a phase of light that passes therethrough.

According to an example embodiment, the top surfaces of the color filters CF1 and CF2 on the pixel area AP may be located on the same plane on which is located the top surface of the second optically black pattern OBP2 on the optically black area OB, and no step difference between the second optically black pattern OBP2 and the color filters CF1 and CF2 may be present in the vicinity of a boundary between the pixel area AP and the optically black area OB. Therefore, the planarization pattern 70 may be formed to be planar, and the color separation lens array layer 60 may also formed to be planar on the planarization pattern 70. Thus, the first nano-posts 66 may be formed in a regular arrangement or in an orderly arrangement rule, and an image sensor may increase in optical properties. Furthermore, the color separation lens array layer 60 may be easily formed on the planarization pattern 70.

Referring still to FIG. 7, the first dielectric layer 64 may be provided on the third protection layer 62. On the third protection layer 62, the first dielectric layer 64 may cover the first nano-posts 66. The first dielectric layer 64 may include a dielectric material whose refractive index is less than that of the first nano-posts 66. The first dielectric layer 64 may include the same material as that of the third protection layer 62. For example, the first dielectric layer 64 may be formed of SiO$_2$ or air.

As set forth above, FIG. 7 depicts an example of a single-layered color separation lens array layer 60. Also, FIG. 8 (discussed in detail below) depicts an example of a bi-layered color separation lens array layer 60. Also, the color separation lens array layer 60 may have a tri- or more multi-layered configuration (not shown).

FIG. 8 depicts an example of a bi-layered color separation lens array layer 60.

Referring to FIG. 8, the color separation lens array layer 60 may have a third protection layer 62-1, a first dielectric layer 64-1, first nano-posts 66-1, a fourth protection layer 62-2, a second dielectric layer 64-2, and second nano-posts 66-2. The third protection layer 62-1, the first dielectric layer 64-1, and the first nano-posts 66-1 may constitute a first layer 60-1 of the color separation lens array layer 60, and the fourth protection layer 62-2, the second dielectric layer 64-2, and the second nano-posts 66-2 may constitute a second layer 60-2 of the color separation lens array layer 60.

The first layer 60-1 of the color separation lens array layer 60 may be provided on the planarization pattern 70. The third protection layer 62-1 may cover the planarization pattern 70. On the pixel area AP, the first nano-posts 66-1 may be disposed on the third protection layer 62-1. The first dielectric layer 64-1 may be provided on the third protection layer 62-1.

The second layer 60-2 of the color separation lens array layer 60 may be provided on the first layer 60-1 of the color separation lens array layer 60. The fourth protection layer 62-2 may cover the first dielectric layer 64-1. On the pixel area AP, the second nano-posts 66-2 may be disposed on the fourth protection layer 62-2. The second dielectric layer 64-2 may be provided on the fourth protection layer 62-2.

The third protection layer 62-1 and the fourth protection layer 62-2 may have a configuration substantially the same as or similar to that of the third protection layer 62 discussed with reference to FIG. 7.

The first dielectric layer 64-1 and the second dielectric layer 64-2 may have a configuration the substantially the same as or similar to that of the first dielectric layer 64 discussed with reference to FIG. 7. The first dielectric layer 64-1 and the second dielectric layer 64-2 may respectively surround the first nano-posts 66-1 and the second nano-posts 66-2. The first nano-posts 66-1 and the second nano-posts 66-2 may be respectively exposed on a top surface of the first dielectric layer 64-1 and a top surface of the second dielectric layer 64-2. In another implementation, the first dielectric layer 64-1 and the second dielectric layer 64-2 may entirely cover the first nano-posts 66-1 and the second nano-posts 66-2, respectively.

The first nano-posts 66-1 and the second nano-posts 66-2 may have a similar configuration as that of the first nano-posts 66 discussed with reference to FIG. 7. When viewed in a plan view, the first nano-posts 66-1 of the first layer 60-1 may be arranged to have their positions different from those of the second nano-posts 66-2 of the second layer 60-2. For example, the first nano-posts 66-1 and the second nano-posts 66-2 may be horizontally shifted. For example, a shift direction of the first nano-posts 66-1 and the second nano-posts 66-2 may depend on an inclination direction of incident light. For example, when a ray incident on an image sensor is inclined from right to left, the second nano-posts 66-2 may be shifted to the right with respect to the first nano-posts 66-1. In contrast, when a ray incident on an image sensor is inclined from left to right, the second nano-posts 66-2 may be shifted to the left with respect to the first nano-posts 66-1.

Although not shown, in consideration of a chief ray angle of incident light, the second nano-posts 66-2 may be shifted with respect to the first nano-posts 66-1 in a direction toward a center of an image sensor. For example, a reduction in distance to a left edge from the center of the image sensor may induce an increase in the degree of rightward shift of the second nano-posts 66-2 with respect to the first nano-posts 66-1, and a reduction in distance to a right edge from the center of the image sensor may induce an increase in the degree of leftward shift of the second nano-posts 66-2 with respect to the first nano-posts 66-1.

A fifth protection layer 68 may be provided on the color separation lens array layer 60. The fifth protection layer 68 may cover the second dielectric layer 64-2 and the second nano-posts 66-2. The fifth protection layer 68 may include silicon nitride (SiN).

FIGS. 9 to 17 illustrate cross-sectional views showing a method of fabricating an image sensor according to an example embodiment.

Figure 9:
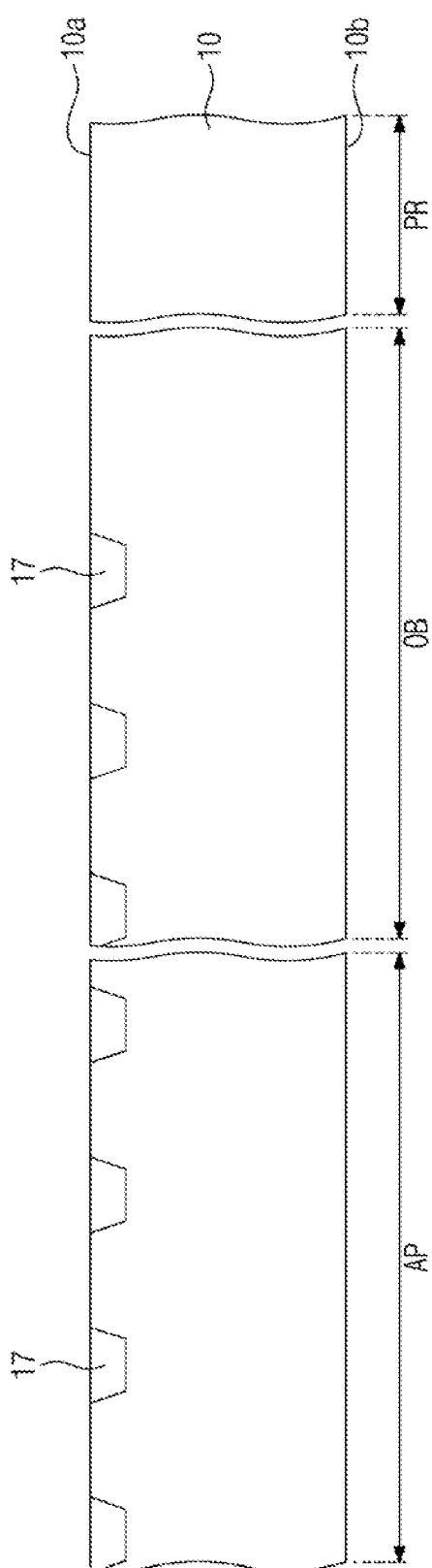

Referring to FIG. 9, a substrate 10 may be provided which has a first surface 10*a* and a second surface 10*b* that are opposite to each other. The substrate 10 may include a pixel area AP, an optically black area OB, and a pad area PR.

The substrate 10 may be or include a semiconductor substrate. The substrate 10 may be doped with impurities having a first conductivity type.

A device isolation pattern 17 may be formed on the first surface 10*a* of the substrate 10. The device isolation pattern 17 may define an active region.

Figure 10:
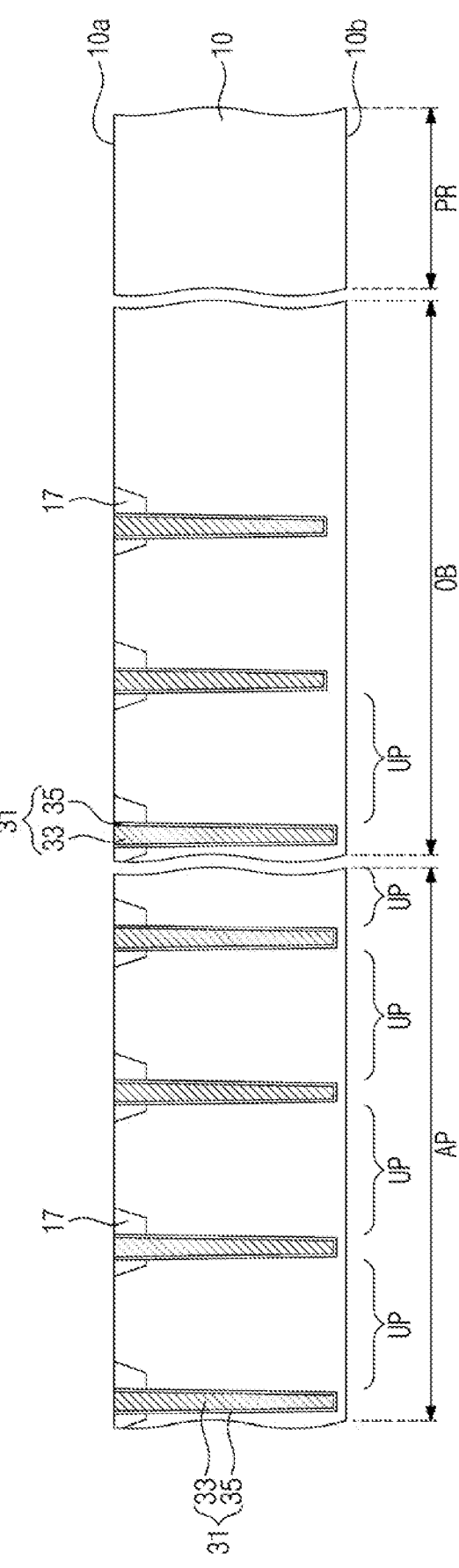

Referring to FIG. 10, the first surface 10*a* of the substrate 10 may undergo an etching process to form a trench on the pixel area AP and the optically black area OB. The trench may be formed to have a width that gradually decreases in a direction from the first surface 10*a* toward the second surface 10*b* of the substrate 10. When viewed in a plan view, the trench may have a grid or lattice structure. The trench may define a plurality of unit pixels UP on the pixel area AP.

A pixel separation part 31 may be formed to fill the trench. The pixel separation part 31 may include a separation conductive pattern 33 and a separation dielectric layer 35. The formation of the separation conductive pattern 33 and the separation dielectric layer 35 may include conformally forming a dielectric layer that partially fills the trench, forming on the dielectric layer a conductive layer that fills the trench, and allowing the dielectric layer and the conductive layer to undergo a planarization process until the first surface 10*a* of the substrate 10 is exposed.

The separation dielectric layer 35 may include a silicon oxide (SiO) layer, a silicon oxynitride (SiON) layer, or a silicon nitride (SiN) layer. The separation conductive pattern 33 may include n-type or p-type doped polysilicon.

Figure 11:
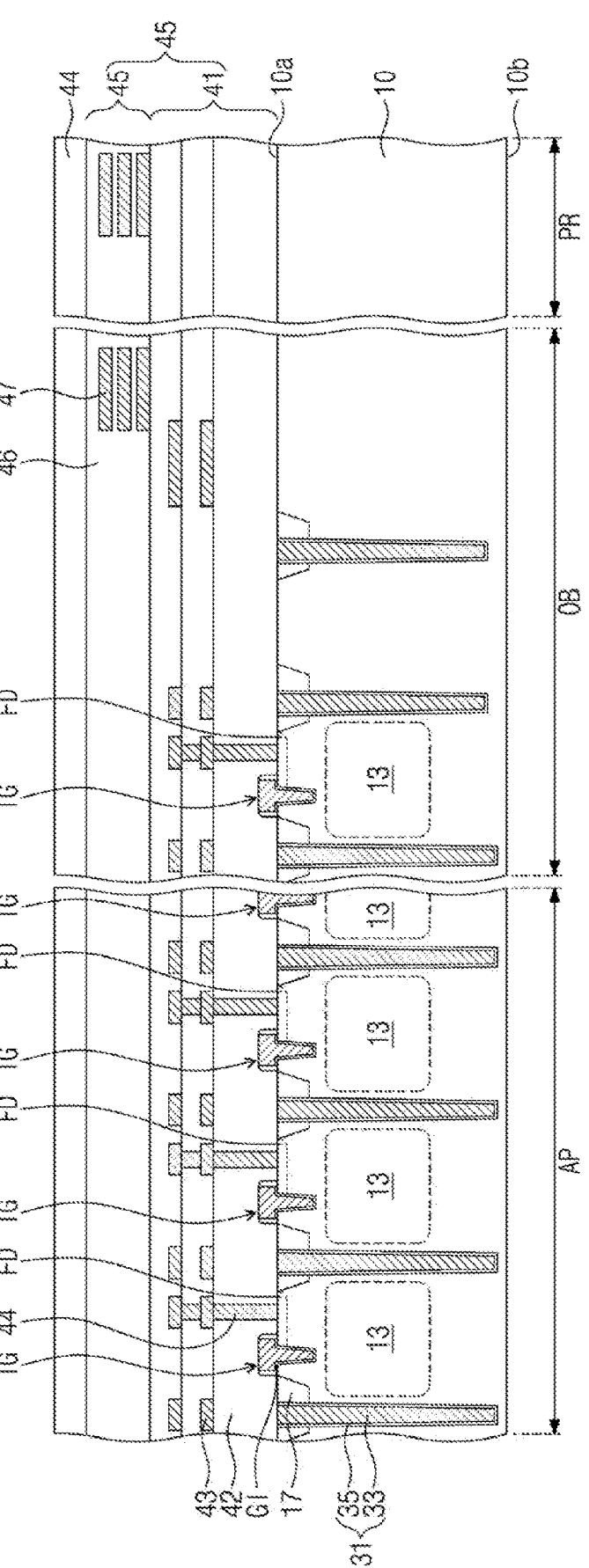

Referring to FIG. 11, impurities having a conductivity type opposite to that of the substrate 10 may be implanted to form photoelectric conversion parts 13 in the substrate 10 on corresponding unit pixels UP of the pixel area AP. Each of the active regions may be doped with impurities to form a floating diffusion region FD. The transfer transistors TX and the logic transistors RX, SX, and DX discussed above with reference to FIG. 2 may be formed on the active patterns.

A wiring layer 40 may be formed on the substrate 10. A first interlayer dielectric layer 42 may be formed on the first surface 10*a* of the substrate 10. First wiring lines 43 may be formed in the first interlayer dielectric layer 42, and contact plugs 44 may be formed to come into connection with the first wiring lines 43. A second interlayer dielectric layer 46 may be formed on the first interlayer dielectric layer 42. Second wiring lines 47 may be formed in the second interlayer dielectric layer 46.

Figure 12:
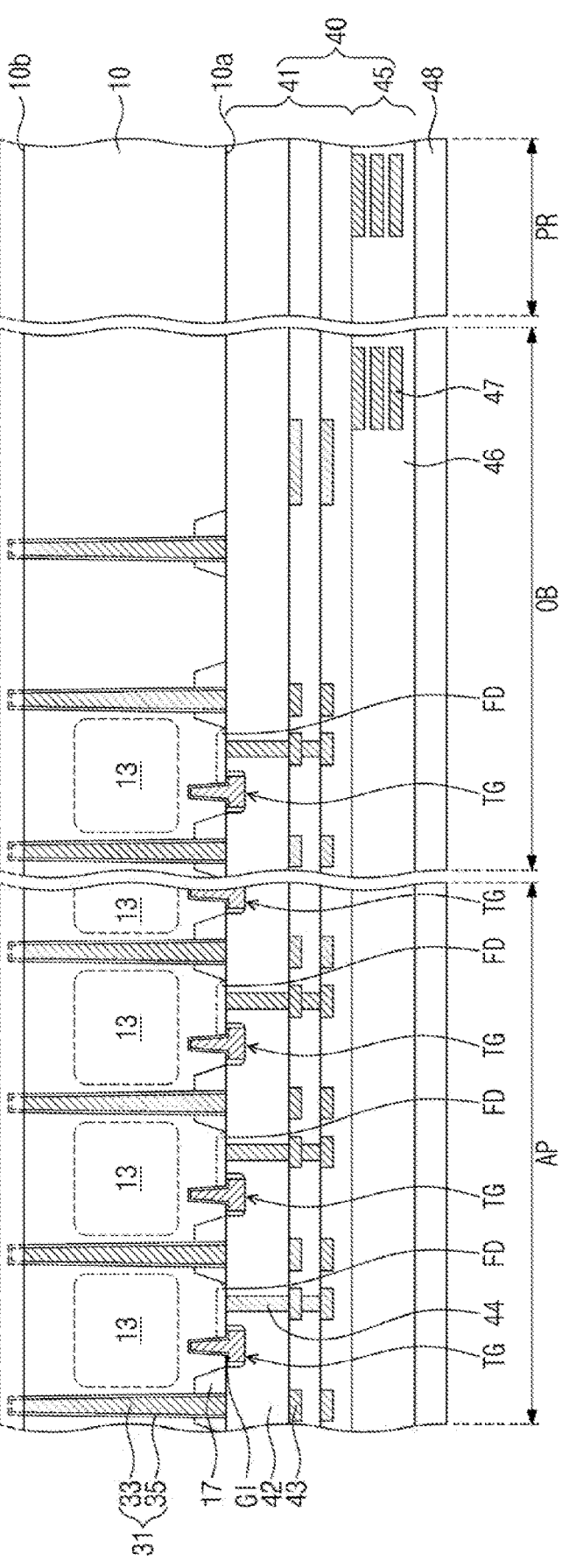

Referring to FIG. 12, the second surface 10*b* of the substrate 10 may undergo a planarization process to expose the pixel separation part 31. The planarization process may include a chemical mechanical polishing (CMP) process.

The planarization process may remove a portion of the substrate 10 and may expose a top surface of the pixel separation part 31. In this step, a top surface of the separation conductive pattern 33 included in the pixel separation part 31 may be exposed, and a top surface of the separation dielectric layer 35 included in the pixel separation part 31 may be exposed.

Figure 13:
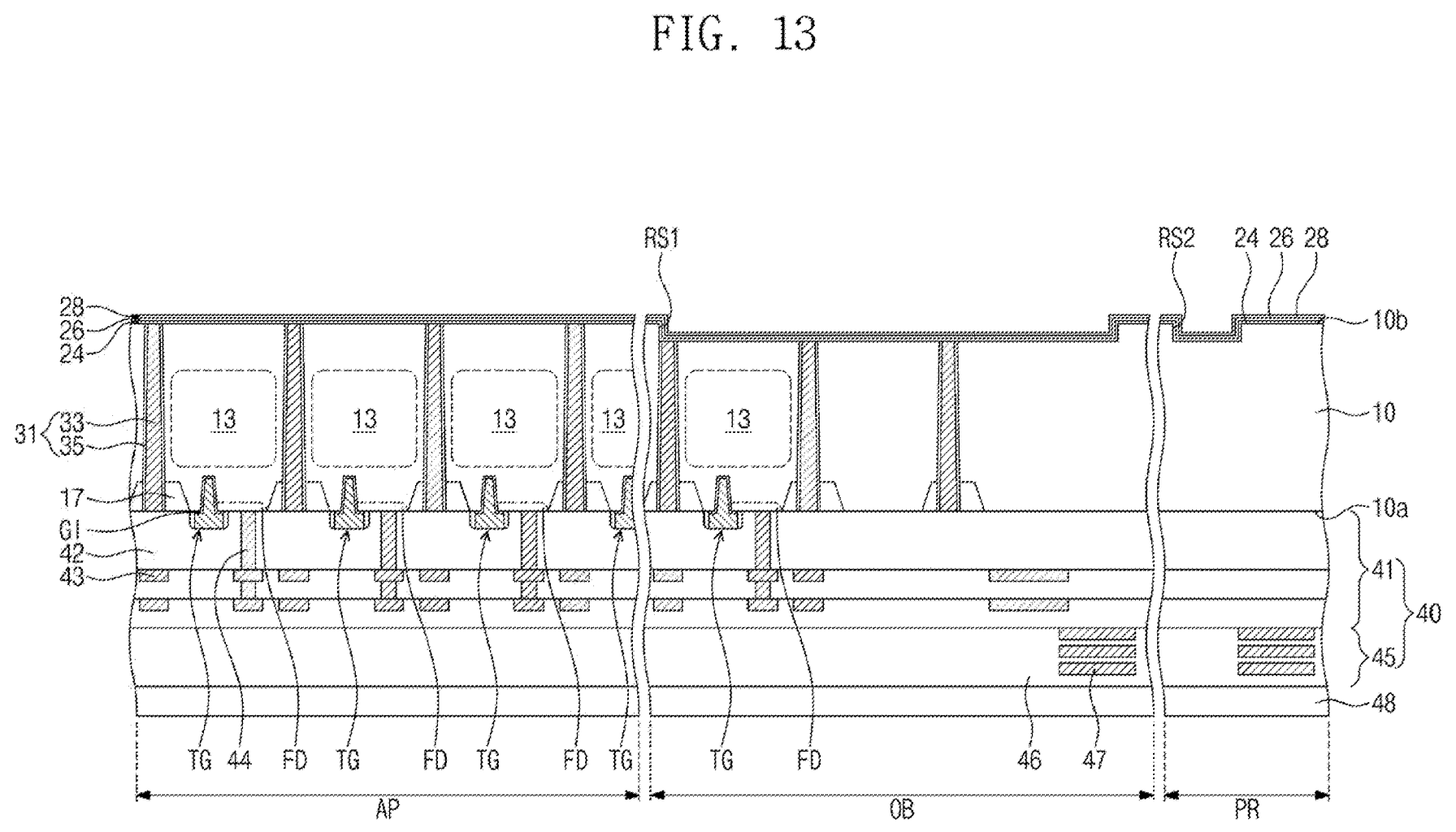

Referring to FIG. 13, a first recess RS1 and a second recess RS2 may be formed on the substrate 10. For example, a mask pattern may be formed on the second surface 10*b* of the substrate 10, and then the mask pattern may be used as an etching mask for performing an etching process to form the first recess RS1 on the optically black area OB and the second recess RS2 on the pad area PR. The first recess RS1 and the second recess RS2 may be formed in the same etching process, and thus the first recess RS1 and the second recess RS2 may have substantially the same depth. Alternatively, the first recess RS1 and the second recess RS2 may be separately formed in individual processes, in which case, the first recess RS1 and the second recess RS2 may be formed to have different depths from each other, and as in the example embodiment described with reference to FIG. 4, the second recess RS2 may be formed to have a depth greater than that of the first recess RS1.

A first fixed charge layer 24 may be conformally formed on the second surface 10*b* of the substrate 10. A second fixed charge layer 26 may be conformally formed on the first fixed charge layer 24. A second protection layer 28 may be conformally formed on the second fixed charge layer 26. The first fixed charge layer 24, the second fixed charge layer 26, and the second protection layer 28 may be formed along a bottom surface and inner sidewalls of the first recess RS1 on the optically black area OB, and may be formed along a bottom surface and inner sidewalls of the second recess RS2 on the pad area PR. In addition, the first fixed charge layer 24, the second fixed charge layer 26, and the second protection layer 28 may cover the pixel separation part 31 on the pixel area AP and the optically black area OB. The first fixed charge layer 24 may be formed of metal oxide or metal fluoride that includes at least one metal selected from hafnium (Hf), zirconium (Zr), aluminum (Al), tantalum (Ta), titanium (Ti), yttrium (Y), and lanthanoid. The second protection layer 28 may include at least one selected from plasma-enhanced tetraethylorthosilicate (PETEOS), silicon oxide (SiO), silicon nitride (SiN), silicon carbonitride (SiCN), hafnium oxide (HfO), and aluminum oxide ($Al_2O_3$).

Figure 14:
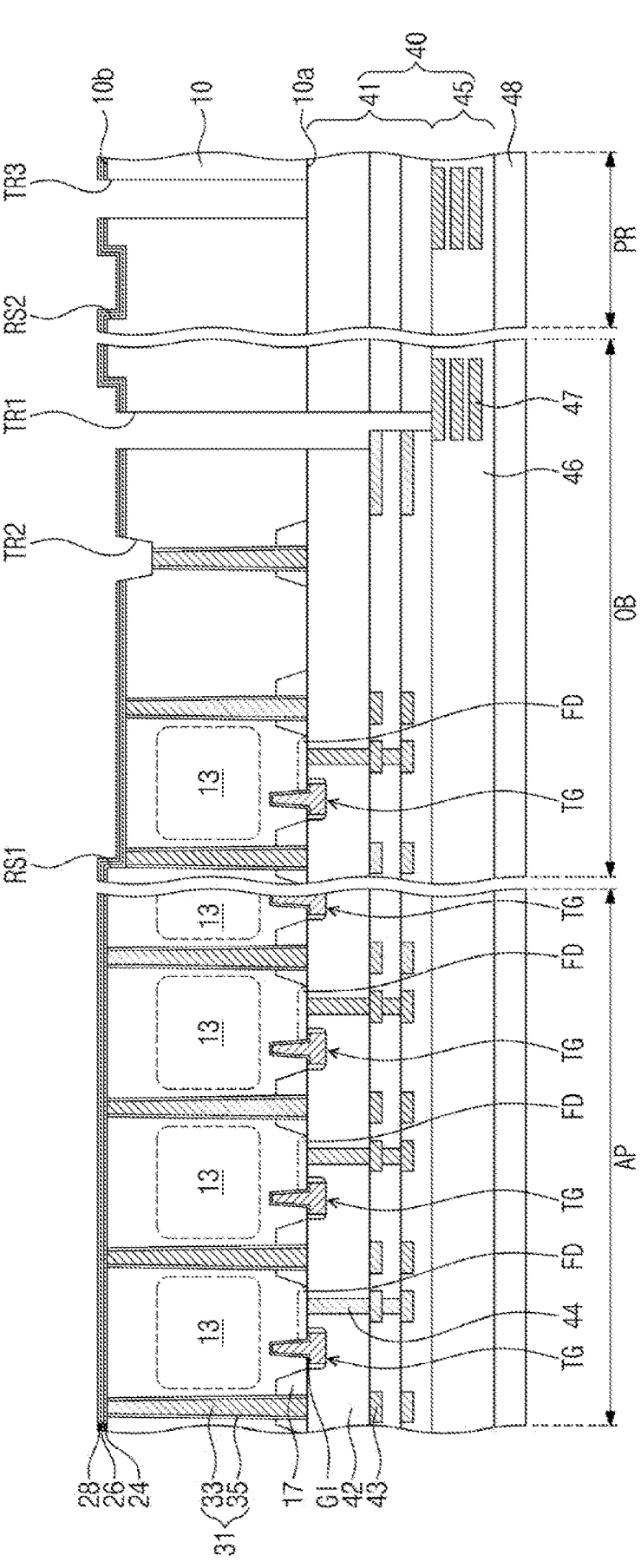

Referring to FIG. 14, a first trench TR1, a second trench TR2, and a third trench TR3 may be formed on the substrate 10. For example, a mask pattern may be formed on the second surface 10*b* of the substrate 10, and then the mask pattern may be used as an etching mask for performing an etching process to form the first trench TR1 and the second trench TR2 on the optically black area OB and the third trench TR3 on the pad area PR.

The first trench TR1 may be formed to extend into the substrate 10 from the bottom surface of the first recess RS1. In this case, within the first recess RS1, the first trench TR1 may penetrate the first fixed charge layer 24, the second fixed charge layer 26, and the second protection layer 28. The first trench TR1 may penetrate the substrate 10 and the upper wiring layer 41 to expose top surfaces of certain first wiring lines 43. On sides of the certain first wiring layers 443, a portion of the first trench TR1 may penetrate the substrate 10, the upper wiring layer 41, and the lower wiring layer 45 to expose a top surface of a certain second wiring line 47.

The second trench TR2 may extend into the substrate 10 from the bottom surface of the first recess RS1. The second trench TR2 may be formed on the pixel separation part 31 on the optically black area OB. In this case, within the first recess RS1, the second trench TR2 may penetrate the first fixed charge layer 24, the second fixed charge layer 26, and the second protection layer 28. The second trench TR2 may penetrate the substrate 10 to expose the separation conductive pattern 33 of the pixel separation part 31.

The third trench TR3 may be formed to extend into the substrate 10 from the second surface 10b of the substrate 10. The third trench TR3 may penetrate the first fixed charge layer 24, the second fixed charge layer 26, and the second protection layer 28. The third trench TR3 may penetrate the substrate 10, the upper wiring layer 41, and the lower wiring layer 45 to expose a top surface of a certain second wiring line 47.

Figure 15:
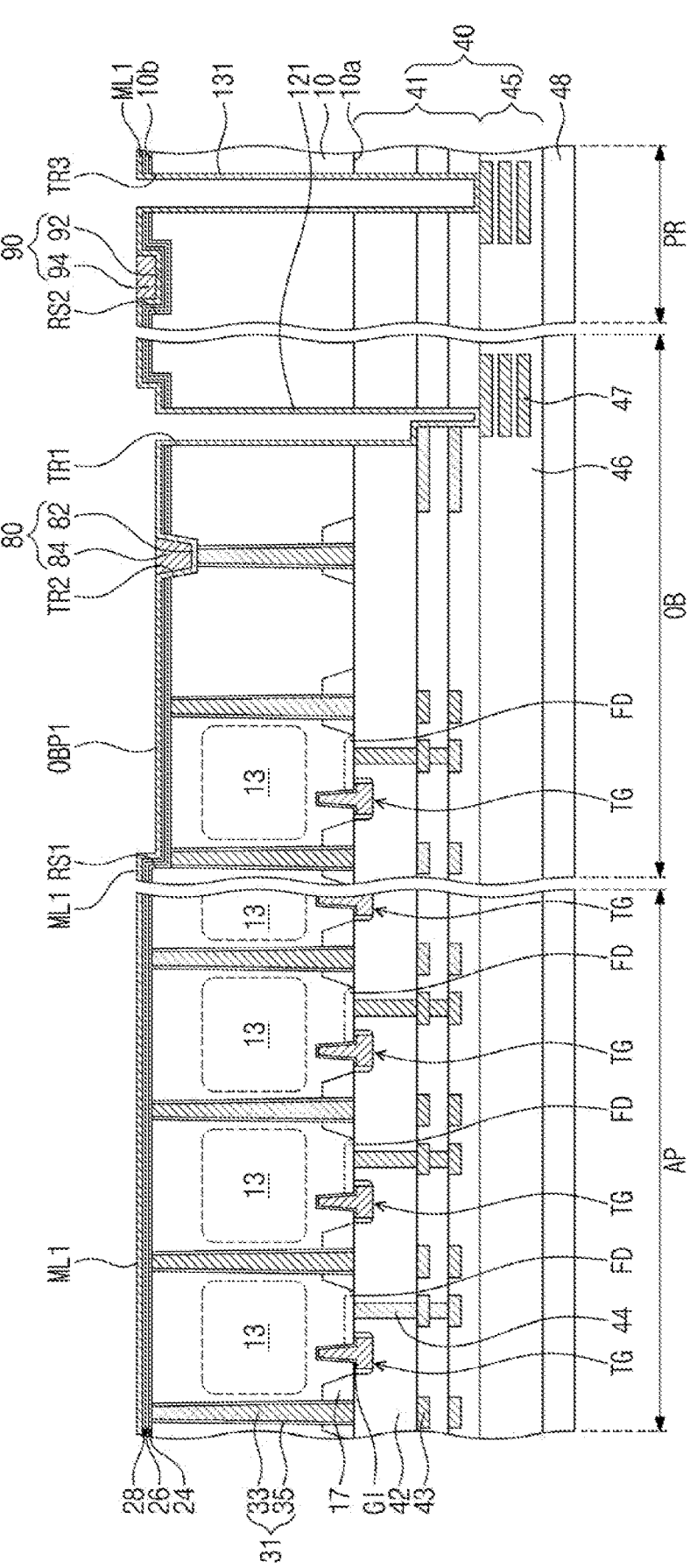

Referring to FIG. 15, a first conductive layer ML1 may be conformally formed on the second protection layer 28. For example, the first conductive layer ML1 may be formed to cover the second protection layer 28 on the pixel area AP, may be formed along inner sides of the first recess RS1, the first trench TR1, and the second trench TR2 while covering the second protection layer 28 on the optically black area OB, and may be formed along inner sides of the second recess RS2 and the third trench TR3 while covering the second protection layer 28 on the pad area PR. The first conductive layer ML1 may include, for example, tungsten (W).

On the optically black area OB, a first conductive pattern 121 may be constituted by the first conductive layer ML1 positioned in the first trench TR1, a first contact pattern 82 may be constituted by the first conductive layer ML1 positioned in the second trench TR2, and a first optically black pattern OBP1 may be constituted by the first conductive layer ML1 positioned in the first recess RS1 and on the second surface 10b of the substrate 10.

On the pad area PR, a second conductive pattern 131 may be constituted by the first conductive layer ML1 positioned in the third trench TR3, and a first pad pattern 92 may be constituted by the first conductive layer ML1 positioned in the second recess RS2.

An unoccupied portion of the second trench TR2 may be filled with a conductive material to form a second contact pattern 84, and an unoccupied portion of the second recess RS2 may be filled with a conductive material to form a second pad pattern 94.

Figure 16:
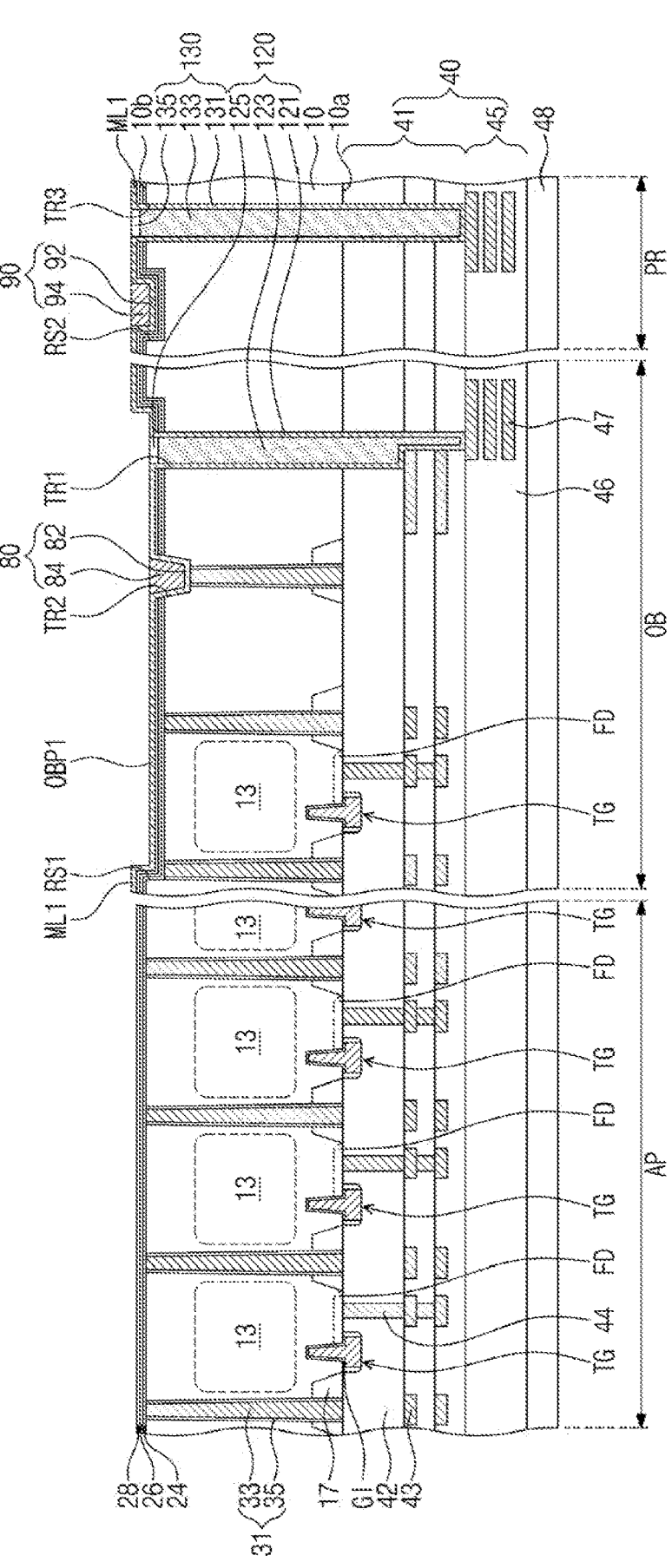

Referring to FIG. 16, in forming a first dielectric pattern 123 and a second dielectric pattern 133, a dielectric layer (not shown) may be formed on the second surface 10b of the substrate 10. The dielectric layer may fill an unoccupied portion of the first trench TR1 and an unoccupied portion of the third trench TR3. Afterwards, an etching process, such as a wet etching, may be performed on the dielectric layer. Therefore, the dielectric layer may remain only in an inside of the first trench TR1 and an inside of the third trench TR3, the dielectric layer in the first trench TR1 may form the first dielectric pattern 123, and the dielectric layer in the third trench TR3 may form the second dielectric pattern 133.

A first capping pattern 125 and a second capping pattern 135 may be respectively formed on the first dielectric pattern 123 and the second dielectric pattern 133. For example, an unoccupied portion of the first trench TR1 may be filled with a dielectric material to form the first capping pattern 125, and an unoccupied portion of the third trench TR3 may be filled with a dielectric material to form the second capping pattern 135. For another example, in a subsequent process where color filters CF1 and CF2 are formed with a dielectric material, unoccupied portions of the first and third trenches TR1 and TR3 may be filled with the dielectric material to form the first capping pattern 125 and the second capping pattern 135.

After that, the first conductive layer ML1 may be patterned to remove the first conductive layer ML1 from the pixel area AP. Thus, the second protection layer 28 may be exposed on the pixel area AP.

Figure 17:
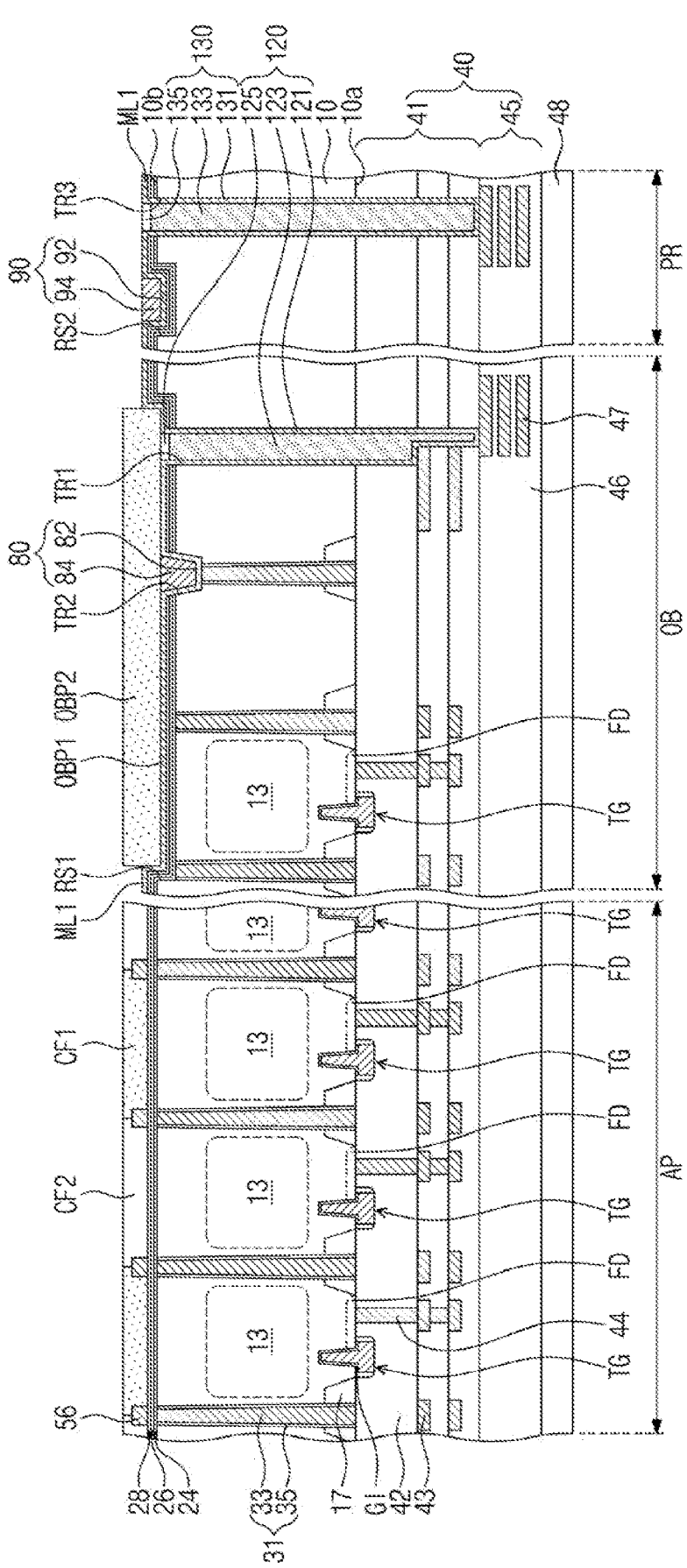

Referring to FIG. 17, on the pixel area AP, a second conductive layer (not shown) may be conformally formed on the second protection layer 28. The second conductive layer may include, for example, tungsten (W). The second conductive layer may be patterned to form a light-shield grid pattern 56 that exposes the second protection layer 28 on the photoelectric conversion part 13.

In some example embodiments, it is illustrated that the light-shield grid pattern 56 is formed separately from the first optically black pattern OBP1, but the light-shield grid pattern 56 may be formed by patterning the first conductive layer ML1 positioned on the pixel area AP in a resultant structure of FIG. 14.

A photolithography process may be performed several times to form color filters CF1 and CF2 and a second optically black pattern OBP2 on the substrate 10. For example, a first photolithography process may be performed to simultaneously form the first color filter CF1 and the second optically black pattern OBP2. A first photosensitive thermosetting resin solution containing a blue pigment may be coated on the second surface 10b of the substrate 10. In this step, the first optically black pattern OBP1 may be formed on the second protection layer 28 on the optically black area OB, and a separate configuration may not be formed on the second protection layer 28 on the pixel area AP. However, as the first recess RS1 is formed on the substrate 10 on the optically black area OB, and the first optically black pattern OBP1 is formed in the first recess RS1, it may be possible to minimize or prevent the occurrence of step difference that the first optically black pattern OBP1 induces between the pixel area AP and the optically black area OB. Therefore, the first photosensitive thermosetting resin solution may be coated with a uniform thickness, and striation defects may be minimized or prevented. The first photosensitive thermosetting resin solution may be heated and cured to form a first photoresist layer. Exposure and development processes may be performed to form the first color filters CF1 and the second optically black pattern OBP2. Thus, the first color filters CF1 and the second optically black pattern OBP2 may be formed to have their exact shapes. In addition, as a step difference may be absent or minimized between the pixel area AP and the optically black area OB, the first color filters CF1 and the second optically black pattern OBP2 may be formed to have their top surfaces at the same level, and in subsequent processes, it may be possible to prevent the occurrence of defects caused by the step difference between the first color filters CF1 and the second optically black pattern OBP2. Subsequently, a second photolithography process may be performed to form second color filters CF2. Alternatively, second and third photolithography processes the same as or similar to each other may be sequentially performed to respectively form second color filters CF2 and third color filters (not shown).

Referring back to FIG. 3, a planarization pattern 70 may be formed on the substrate 10. As a step difference may be absent or minimized between the first color filters CF1 and the second optically black pattern OBP2, the planarization pattern 70 may have a top surface that is substantially flat, and even when the planarization pattern 70 is formed to have a small thickness, the planarization pattern 70 may be easily formed to have a flat top surface.

Afterwards, a microlens array layer ML may be formed on the planarization pattern 70.

An image sensor according to an example embodiment may be configured such that top surfaces of color filters on a pixel area may be located on the same plane on which is located a top surface of a second optically black pattern on an optically black area. Therefore, a step difference between the color filters and the second optically black pattern may be absent in the vicinity of a boundary between the pixel area and the optically black area, and a top end of the image sensor may be substantially flat on the pixel area and the optically black area. Accordingly, the image sensor may increase in structural stability.

As the step difference between the color filters and the second optically black pattern is minimized in the vicinity of a boundary between the pixel area and the optically black area, the color filters and the second optically black pattern may be formed to have their exact shapes. In processes after the formation of the color filters and the second optically black pattern, it may be possible to prevent the occurrence of failure caused by a step difference between first color filters and the second optically black pattern.

As described above, example embodiments may provide an image sensor whose structural stability is increased and a method of fabricating the same. Example embodiments may provide a method of fabricating an image sensor with less occurrence of failure and an image sensor fabricated by the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a substrate including a pixel area and an optically black area, and having a first surface and a second surface that are opposite to each other, wherein the second surface has a first recess formed therein in the optically black area;
a plurality of color filters on the second surface of the substrate on the pixel area;
a first optically black pattern in the first recess; and
a second optically black pattern on the optically black area and between the first optically black pattern and the substrate,
wherein, in the first recess, the second optically black pattern covers lateral surfaces and a bottom surface of the first optically black pattern,
wherein the first optically black pattern is formed of a material that is the same as a material forming a color filter of the plurality of color filters, and wherein top surfaces of the plurality of color filters and a top surface of the first optically black pattern are at the same level.

2. The image sensor as claimed in claim 1, wherein an uppermost end of the second optically black pattern is at a level that is the same as or lower than the level of the top surface of the first optically black pattern.

3. The image sensor as claimed in claim 1, wherein the second optically black pattern includes a material that is different from the material of the first optically black pattern and materials of the plurality of color filters.

4. The image sensor as claimed in claim 1, wherein the second optically black pattern includes tungsten (W).

5. The image sensor as claimed in claim 1, wherein the substrate further includes a pad area, and
wherein the image sensor further comprises a conductive pad in a second recess on the second surface of the substrate on the pad area.

6. The image sensor as claimed in claim 5, wherein a bottom surface of the second recess is at a level that is the same as or lower than a level of a bottom surface of the first recess.

7. The image sensor as claimed in claim 5,
wherein the second optically black pattern extends onto the pad area, and in the first recess, covers lateral surfaces and a bottom surface of the first optically black pattern.

8. The image sensor as claimed in claim 1, further comprising a planarization pattern on the second surface of the substrate on the pixel area and the optically black area,
wherein the planarization pattern covers the plurality of color filters and the first optically black pattern, and
wherein a top surface of the planarization pattern is flat.

9. The image sensor as claimed in claim 1, further comprising:
an interlayer dielectric layer on the first surface of the substrate;
a wiring line in the interlayer dielectric layer; and
a via plug that penetrates the substrate and a portion of the interlayer dielectric layer to electrically connect the second optically black pattern to the wiring line.

10. An image sensor, comprising:
a substrate that includes a pixel area, an optically black area, and a pad area;
a first recess on a top surface of the substrate on the optically black area;
a second recess on the top surface of the substrate on the pad area;
a plurality of color filters on the substrate on the pixel area;
a first optically black pattern that conformally covers a bottom surface and inner lateral surfaces of the first recess on the optically black area;
a second optically black pattern that fills an unoccupied portion of the first recess on the optically black area; and
a conductive pad on the substrate on the pad area,
wherein the second optically black pattern includes a material that is the same as a material of a color filter of the plurality of color filters, and
wherein the first optically black pattern includes a material that is different from the material of the second optically black pattern and the materials of the plurality of color filters.

11. The image sensor as claimed in claim 10, wherein top surfaces of the plurality of color filters and a top surface of the second optically black pattern are at the same level.

12. The image sensor as claimed in claim 10, wherein the bottom surface of the first recess and a bottom surface of the second recess are at the same level.

13. The image sensor as claimed in claim 10, wherein an uppermost end of the first optically black pattern is at a level that is the same as or lower than a level of a top surface of the second optically black pattern.

14. The image sensor as claimed in claim 10, wherein the first optically black pattern includes tungsten.

15. The image sensor as claimed in claim 10, wherein the first optically black pattern extends onto the pad area, and in the second recess, is between the conductive pad and the second recess.

16. The image sensor as claimed in claim 10, further comprising a planarization pattern on the top surface of the substrate on the pixel area and the optically black area, wherein the planarization pattern covers the plurality of color filters and the second optically black pattern, and wherein a top surface of the planarization pattern is flat.

17. The image sensor as claimed in claim 10, further comprising:

an interlayer dielectric layer on a bottom surface of the substrate;

a wiring line in the interlayer dielectric layer; and a via plug that penetrates the substrate and a portion of the interlayer dielectric layer to electrically connect the first optically black pattern to the wiring line.

18. An image sensor, comprising:

a substrate that includes a pixel area and an optically black area;

a plurality of color filters on a top surface of the substrate on the pixel area;

a first optically black pattern in a recess on the top surface of the substrate on the optically black area;

a protection layer on the pixel area and the optically black area, the protection layer covering the plurality of color filters and the first optically black pattern on the top surface of the substrate; and a color separation lens array layer on the protection layer, wherein the color separation lens array layer has sections which each correspond to a respective color filter of the plurality of color filters and the color separation lens array layer includes a plurality of nano-posts disposed therein, the nano-posts of the plurality of nano-posts being arranged to branch rays of light included in incident light from the color separation lens array layer toward the plurality of color filters, the rays of light having differing wavelengths from one another, wherein the first optically black pattern includes a material that is the same as a material of a first color filter of the plurality of color filters, and wherein top surfaces of the plurality of color filters and a top surface of the first optically black pattern are on one plane.

19. The image sensor as claimed in claim 18, further comprising a second optically black pattern on the optically black area and between the first optically black pattern and a bottom surface of the recess, wherein the second optically black pattern includes a material that is different from the material of the first optically black pattern and the materials of the plurality of color filters, and wherein the top surfaces of the plurality of color filters and the top surface of the first optically black pattern are at the same level from the top surface of the substrate.

\*   \*   \*   \*   \*